(12) United States Patent
Hishiki et al.

(10) Patent No.: US 11,062,983 B2
(45) Date of Patent: *Jul. 13, 2021

(54) SUBSTRATE FOR MOUNTING SEMICONDUCTOR ELEMENT

(71) Applicant: Ohkuchi Materials Co., Ltd., Kagoshima (JP)

(72) Inventors: Kaoru Hishiki, Isa (JP); Keiichi Otaki, Isa (JP); Hidehiko Sasaki, Isa (JP); Kotaro Tomeoka, Isa (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/825,299

(22) Filed: Mar. 20, 2020

(65) Prior Publication Data

US 2020/0303289 A1    Sep. 24, 2020

(30) Foreign Application Priority Data

Mar. 22, 2019    (JP) .............................. JP2019-055687

(51) Int. Cl.
*H05K 1/11*    (2006.01)
*H05K 1/18*    (2006.01)
(Continued)

(52) U.S. Cl.
CPC .. *H01L 23/49582* (2013.01); *H01L 23/49541* (2013.01); *H05K 1/11* (2013.01);
(Continued)

(58) Field of Classification Search
CPC ......... H01L 23/49582; H01L 23/49541; H01L 24/48; H01L 2224/48091;
(Continued)

(56) References Cited

U.S. PATENT DOCUMENTS 10,211,131 B1*  2/2019  Kitnarong ............. H01L 21/563
10,777,492 B1*  9/2020  Hishiki ..................... H05K 1/11
(Continued)

FOREIGN PATENT DOCUMENTS

JP    4032063 B2    1/2008

*Primary Examiner* — Ishwarbhai B Patel
(74) *Attorney, Agent, or Firm* — Westerman, Hattori, Daniels & Adrian, LLP

(57) ABSTRACT

A substrate for mounting a semiconductor element thereon has columnar terminal portions formed by concavities provided on an upper surface of a metal plate made of a copper-based material, and is provided with a roughened silver plating layer having acicular projections, applied, as the outermost plating layer, to top faces of the columnar terminal portions. The roughened silver plating layer has a crystal structure in which the crystal direction <101> occupies a largest proportion among the crystal directions <001>, <111> and <101>. The substrate for mounting a semiconductor element thereon facilitates thin design of semiconductor packages produced by flip-chip mounting, can be manufactured with improved productivity owing to reduction in cost and operation time, achieves remarkably high adhesion to sealing resin while keeping the total thickness of plating layers including the silver plating layer to be thin.

4 Claims, 16 Drawing Sheets

(51) Int. Cl.
*H01L 23/495* (2006.01)
*H01L 23/00* (2006.01)
*H01L 21/48* (2006.01)
*H01L 21/56* (2006.01)
*H05K 1/03* (2006.01)

(52) U.S. Cl.
CPC .......... *H05K 1/111* (2013.01); *H01L 21/4846* (2013.01); *H01L 21/565* (2013.01); *H01L 24/32* (2013.01); *H01L 24/48* (2013.01); *H01L 24/73* (2013.01); *H01L 2224/32245* (2013.01); *H01L 2224/48091* (2013.01); *H01L 2224/48245* (2013.01); *H01L 2224/73265* (2013.01); *H05K 1/03* (2013.01); *H05K 1/18* (2013.01)

(58) Field of Classification Search
CPC ....... H01L 2224/48245; H01L 21/4846; H01L 2224/32245; H01L 24/73; H01L 2224/73265; H01L 21/565; H01L 24/32; H01L 21/4832; H01L 23/49548; H01L 23/3142; H01L 23/3107; H01L 21/561
See application file for complete search history.

(56) References Cited

U.S. PATENT DOCUMENTS

| | | | |
|---|---|---|---|
| 10,847,451 B2 * | 11/2020 | Hishiki | H01L 21/4828 |
| 2003/0132025 A1 | 7/2003 | Wakihara et al. | |
| 2017/0231101 A1 | 8/2017 | Miki et al. | |
| 2018/0053709 A1 * | 2/2018 | Crema | H01L 21/4853 |

\* cited by examiner

SUBSTRATE FOR MOUNTING SEMICONDUCTOR ELEMENT

CROSS-REFERENCE TO RELATED PATENT APPLICATIONS

This application claims the benefit of Japanese Patent Application No. 2019-055687 filed in Japan on Mar. 22, 2019, the contents of which are incorporated herein by reference.

BACKGROUND OF THE INVENTION

1) Field of the Invention

The present invention relates to a substrate for mounting a semiconductor element thereon that is provided with silver plating as an outermost plating on top faces of columnar terminal portions formed by concavities provided on the upper surface of a metal plate made of a copper-based material and that is to be processed at the metal plate in manufacturing a semiconductor package.

2) Description of Related Art

In accordance with demands for higher pin count, smaller size and thinner shape, there have emerged various kinds of semiconductor packages such as BGA (Ball Grid Array) packages which use solder balls, CPS (Chip Size Package) in which outer leads are arranged under a semiconductor element, packages in which semiconductor elements are flip-chip connected, etc.

Of these packages, as those can satisfy the above demands at a relatively low cost, there are QFN (Quad Flat Non-lead) type packages which are resin-sealed after semiconductor elements are flip-chip connected with terminals for mounting the semiconductor elements.

For example, Japanese Patent No. 4032036 describes a semiconductor package in which a semiconductor element is flip-chip mounted. In manufacturing this semiconductor package, upon use of a substrate for mounting semiconductor element thereon in which columnar terminal portions with internal connection terminals for flip-chip mounting arranged at the top faces thereof are formed on the upper surface side by half-etching performed on the upper surface side of a metal material, resin-sealing is performed on the upper surface side of the substrate for mounting semiconductor element thereon, and then half-etching is performed on the lower surface side, to isolate the columnar terminal portions for flip-chip mounting as well as to form external connection terminal portions on the lower surface side.

In order to form external connection terminal portions, gold plating is applied in advance to sites that are to be external connection terminal portions and then half-etching is performed upon use of this gold plating as a mask, to isolate the columnar terminal portions for flip-chip mounting. Therefore, the metal material at the sites where the columnar terminal portions are formed is not etched either from the upper surface side or from the lower surface side and thus remains with its original thickness.

In the semiconductor package described in Japanese Patent No. 4032063, gold plating is applied to the lower surface of a metal material that is to be external connection terminal portions, and half-etching is performed upon use of this gold plating as a mask, to form external connection terminal portions. The gold plating on the lower surface of the external connection terminal portions is considered to be necessary for solder bonding between the external connection terminal portions and the board.

While resin-sealing is performed after flip-chip connection of a semiconductor element with the internal connection terminal portions, the amount of projection of the columnar terminal portions is small.

For improving adhesion between the columnar terminal portions and the resin, consideration can be made to form an undercoat plating layer to have a roughened outer surface and to laminate thereon a noble metal plating layer following the shape of the roughened surface. In order to form the outer roughened surface of the undercoat plating layer to have such irregularities as to improve adhesion to the resin even if the noble metal plating layer is laminated thereon, the undercoat plating layer should be formed thick.

As another measure to improve adhesiveness to resin, it can be considered to roughen the outer surface of a noble metal plating layer after the noble metal plating layer is formed to be smooth on the surface of the columnar terminal portions. In order to shape the outer surface of the noble metal plating layer to have such irregularities as to improve adhesion to the resin, it is necessary to form the noble metal plating layer, as a smooth layer before roughening treatment, to be thick.

After repeated trial and error, the present inventors have found it possible to improve productivity by reducing cost and working time for forming a roughened surface, while keeping the total thickness of the plating layer to be thin as well as remarkably increasing adhesion to the sealing resin.

SUMMARY OF THE INVENTION

A substrate for mounting a semiconductor element thereon according to embodiment modes of the present invention has columnar terminal portions formed by concavities formed on the upper surface of a metal plate made of a copper-based material, wherein top faces of the columnar terminal portions are provided with, as an outermost layer, a roughened silver plating layer having acicular projections, and the roughened silver plating layer has a crystal structure in which the crystal direction <101> occupies a largest proportion among the crystal directions <001>, <111> and <101>.

According to the embodiment modes of the present invention, a substrate for mounting a semiconductor element thereon, in which silver plating as the outermost plating is applied to top faces of columnar terminal portions formed by concavities formed on the upper surface of a metal plate made of a copper-based material, encourages thinner design of semiconductor packages fabricated by flip-chip mounting, can be manufactured with improved productivity owing to reduction in cost and operation time, and achieves remarkably high adhesion to sealing resin while keeping the total thickness of plating layers including the silver plating layer to be small.

These and other features of the present invention will become apparent from the following detailed description of the preferred embodiments when taken in conjunction with the accompanying drawings.

BRIEF DESCRIPTION OF THE DRAWINGS

FIG. 1A is a top view, FIG. 1B is a bottom view and FIG. 1C is an explanatory diagram schematically showing the A-A cross section in FIG. 1A.

FIG. 5A is a top view, FIG. 5B is a bottom view and FIG. 5C is an explanatory diagram schematically showing a B-B cross section in FIG. 5A.

FIG. 8A is a top view, FIG. 8B is a bottom view and FIG. 8C is an explanatory diagram schematically showing the C-C cross section in FIG. 8A.

FIG. 12A is a top view, FIG. 12B is a bottom view and FIG. 12C is an explanatory diagram schematically showing a D-D cross section in FIG. 12A.

DETAILED DESCRIPTION OF THE EMBODIMENTS

Preceding the description of the embodiment modes, the background leading to the derivation of the present invention and the operation and effect of the present invention will be described.

Figure 15:
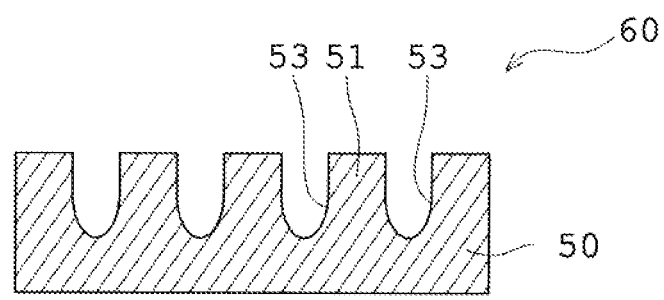
FIG. 15 is a schematic explanatory diagram that shows one example of the essential configuration of a substrate for mounting a semiconductor element thereon derived by the present inventors before they derived the present invention.

After the repeated trial and error, the present inventors had derived, before they derived the present invention, as a substrate for mounting a semiconductor element thereon that facilitates thinning of a semiconductor package in which a semiconductor element is flip-chip mounted, a substrate 60 for mounting a semiconductor element thereon in which a metal plate 50 made of a copper-based material as shown in FIG. 15 is half-etched from the upper surface side so that a plurality of columnar terminal portions 51 for flip-chip mounting arrayed in a matrix are formed on the upper surface side of the metal plate 50 and concavities 53 to be filled with resin for fixing the columnar terminal portions 51 are formed between the individual columnar terminal portions 51.

Figure 16:
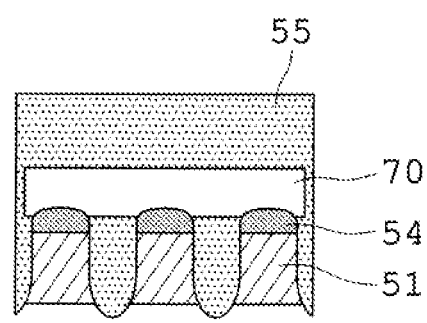
FIG. 16 is an explanatory diagram that shows one example of semiconductor package in which a semiconductor element is flip-chip mounted upon use of the substrate for mounting a semiconductor element thereon of FIG. 15.

By use of this substrate 60 for mounting a semiconductor element thereon, in manufacturing a semiconductor package, after a semiconductor element 70 is flip-chip mounted on the top faces of the columnar terminal portions 51 via solder 54 and sealing is conducted with sealing resin 55, the entirety of the lower surface side of the metal plate 50 is half-etched, to isolate the individual columnar terminal portions 51 as well as to expose the lower faces of the individual columnar terminal portions 51 as isolated and the sealing resin 55, as shown in FIG. 16. Thereby, the metal plate serving as a base material of the substrate for mounting a semiconductor element thereon can be thinned to about half the thickness, to facilitate thinning of the semiconductor package.

As a result of further study and consideration, the present inventors have found that, since the columnar terminal portions 51 for flip-chip mounting formed by half-etching process had a small amount of projection from the metal plate 50 in the substrate 60 for mounting a semiconductor element thereon shown in FIG. 15, the adhesion between the sealing resin 55 and the columnar terminal portions 51 as the semiconductor package shown in FIG. 16 was manufactured was weak and thus detachment of the terminals may occur.

At that stage, the present inventors considered, as a measure to improve adhesion between the columnar terminal portions and the resin, the configuration in which an undercoat plating layer on the top faces of the columnar terminal portions is formed to have roughened outer surface and thereon a noble metal plating layer is laminated as following the shape of the roughened surface. However, in order to form the roughened outer surface of the undercoat plating layer to have such irregularities as to maintain high adhesion to the resin even if the noble metal plating layer is laminated thereon, the undercoat plating layer has to be formed thick. Moreover, since the plating speed for forming the undercoat plating layer with a roughened surface is slow, the working time increases to raise the cost and lower the productivity.

Also, the present inventors considered, as another measure for improving adhesion to the resin, the configuration in which a noble metal plating layer is processed, after being formed on the top faces of the columnar terminal portions as having a smooth outer surface, to have its outer surface roughened. However, in order to form the outer surface of the noble metal plating layer to be a roughened surface having such irregularities as to improve adhesion to the resin, the smooth noble metal plating layer before roughening treatment should be formed thick, and thus the cost of noble metal plating layer increases and the productivity is lowered.

Next, the present inventors considered that, in order to improve adhesion to the sealing resin and to reduce the total thickness of plating layers while reducing the cost and working time for forming a roughened outer surface for improved productivity, it was necessary to form, either directly on the top faces of the columnar terminal portions or on an undercoat plating layer with a smooth outer surface formed on the top faces of the columnar terminal portions, a silver plating layer with a roughened outer surface not by roughening the outer surface of a smooth silver plating layer.

Then, in the process of trial and error, the present inventors have derived a substrate for mounting a semiconductor element thereon in which a roughened silver plating layer with acicular projections formed not by roughening the outer surface of a smooth silver plating layer is provided as the outermost layer covering the top faces of the columnar terminal portions.

In the present application, the acicular projections included in the roughened silver plating layer are defined as an aggregate of a plurality of acicular projections having a surface area ratio (here, the ratio of the surface area of the roughened silver plating layer to the surface area of the corresponding smooth surface) of 1.30 or more and 6.00 or less.

It has been found that a roughened silver plating layer having acicular projections with such a surface area ratio would make sealing resin easily flow into the roots of the individual acicular projections, so that, when the sealing resin is cured, the large contact area and the intricate contour can enhance the physical anchor effect.

Further, as a result of repeated trial and error by the present inventors, it has been found that a roughened silver plating layer having acicular projections could be formed by growing a crystal structure in which the proportion of a predetermined crystal direction is high as being different from a crystal structure of a conventional smooth silver plating layer or a roughened silver plating layer formed by roughening the outer surface of a smooth silver plating layer, and that the roughened surface having the acicular projections formed of well-grown such a crystal structure would be effective in remarkably improving adhesion to sealing resin compared with a roughened surface formed by the conventional technique. In this way, the present invention has been derived.

A substrate for mounting a semiconductor element thereon of the embodiment modes of the present invention has columnar terminal portions formed by concavities formed on the upper surface of a metal plate made of a copper-based material, wherein top faces of the columnar terminal portions are provided with, as an outermost layer, a roughened silver plating layer having acicular projections, and the roughened silver plating layer has a crystal structure in which the crystal direction <101> occupies a largest proportion among the crystal directions <001>, <111> and <101>.

As in the substrate for mounting a semiconductor element thereon of the embodiment modes of the present invention, if a roughened silver plating layer has acicular projections having a surface area ratio of 1.30 or more and 6.00 or less (i.e. the ratio of the surface area of the roughened silver plating layer to the surface area of the corresponding smooth surface), sealing resin would easily flow into the roots of the individual acicular projections. Therefore, when the sealing resin is cured, the large contact area and the intricate contour can enhance the physical anchor effect, to achieve good adhesion. The directions in which the individual acicular projections extend are not uniform; not only the upward direction and oblique directions but also the shape of bent needles are included. If the individual acicular projections are randomly extended radially, the anchor effect on the sealing resin can be further enhanced.

In addition, as in the substrate for mounting a semiconductor element thereon of the embodiment modes of the present invention, if a roughened silver plating layer with acicular projections provided as the outermost layer on the top faces of the columnar terminal portions is configured to have a crystal structure in which the crystal direction <101> occupies a largest proportion among the crystal directions <001>, <111> and <101>, such a roughened silver plating layer allows sealing resin to easily flow into its deeper portions and accordingly exerts higher adhesion to the sealing resin than other roughened silver plating layers such as those having roughened surfaces with a surface area ratio (i.e. the ratio of the surface area of the silver plating layer to the surface area of the corresponding smooth surface) of less than 1.30 and those formed by roughening the outer surface of a smooth silver plating layer having the conventional crystal structure, which is different from the crystal structure in which the crystal direction <101> occupies a largest proportion among the crystal directions <001>, <111> and <101>.

Also, if the configuration is made as in the substrate for mounting a semiconductor element thereon according to the embodiment modes of the present invention, at the semiconductor element mounting portion, on which a semiconductor element is to be mounted, and at internal connection terminal portions, which are to be electrically connected with the semiconductor element directly or via wires, on the upper surface side of the columnar terminal portions, the contact area with the connection member such as solder or paste is increased by the acicular projections of the roughened silver plating layer, whereby seepage of moisture can be prevented, the strain caused by thermal expansion is prevented, and delamination between the connection member and the plating film is prevented.

The roughened silver plating layer having acicular projections with a crystal structure in which the crystal direction <101> occupies a largest proportion among the crystal directions <001>, <111> and <101> of the substrate for mounting a semiconductor element thereon according to the embodiment modes of the present invention can be formed by use of the sites corresponding to the columnar terminal portions on the upper surface of the metal plate, which is a base material of the substrate for mounting a semiconductor element thereon, as a base.

Also, if the configuration is made as in the substrate for mounting a semiconductor element thereon according to the embodiment modes of the present invention, adhesion to the sealing resin can be remarkably improved by the roughened silver plating layer having acicular projections with a crystal structure in which the crystal direction <101> occupies a largest proportion among the crystal directions <001>, <111> and <101>. Accordingly, in the case where a barrier plating layer is needed to be formed as an undercoat plating layer for preventing copper constituting the material of the columnar terminal portions from diffusing under a high temperature environment, forming a thin and smooth barrier plating layer having a sufficient thickness for preventing diffusion of the base copper serves the purpose; it is not necessary to form a barrier plating layer with a roughened surface.

The roughened silver plating layer having acicular projections with a crystal structure in which the crystal direction <101> occupies a largest proportion among the crystal directions <001>, <111> and <101> can be formed by silver plating under the conditions described later, without roughening the surface of a smooth silver plating layer.

Therefore, by employing the substrate for mounting a semiconductor element thereon of the embodiment modes of the present invention, it is possible to minimize the processing cost of the roughened surface for improved adhesion with resin, and to minimize the total thickness of the plating layers.

Further, in the substrate for mounting a semiconductor element thereon of the embodiment modes of the present invention, preferably, the average diameter of crystal grains in the roughened silver plating layer is smaller than 0.28 µm.

If the average diameter of crystal grains in the roughened silver plating layer is 0.28 µm or greater, after crystals for silver plating grow in the height direction, spaces between the crystals come to be wide and thus the surface area ratio (i.e. the ratio of the surface area of the roughened silver plating layer to the surface area of the corresponding smooth surface) fails to be within the range of 1.30 to 6.00.

If the average diameter of crystal grains in the roughened silver plating layer is smaller than 0.28 µm, after crystals for silver plating grow in the height direction, spaces between the crystals come to be narrow and thus the surface area ratio (i.e. the ratio of the surface area of the roughened silver plating layer to the surface area of the corresponding smooth surface) can be within the range of 1.30 to 6.00. More preferably, the roughened silver plating layer has crystal grains with an average diameter of 0.15 µm or more and 0.25 µm or less.

In the substrate for mounting a semiconductor element thereon of the embodiment modes of the present invention, an undercoat plating layer may be provided between the top faces of the columnar terminal portions and the roughened silver plating layer.

It is preferable that the shape of the acicular projections included in the roughened silver plating layer in the substrate for mounting a semiconductor element thereon of the embodiment modes of the present invention is determined only by the roughened silver plating layer itself without being affected by the surface shape of the base thereunder. The surface state of the base may be smooth or roughened. In consideration of costs such as productivity, it is preferable that the base is prepared only by activation treatment on outer faces of the sites corresponding to the columnar terminal portions on the upper surface of the metal plate serving as a base material of the substrate for mounting a semiconductor element thereon, on which a roughened silver plating layer is to be formed. In the case where the influence of diffusion of copper, which forms a material of the columnar terminal portions as a base, under a high temperature environment should be taken into consideration, it is preferable to provide a smooth undercoat plating layer as a barrier plating layer between the columnar terminal portions and the roughened silver plating layer. In this case, since it suffices to form the plating layer thinly and smoothly to a thickness as to prevent diffusion of the base copper, a thin undercoat layer is preferable.

According to the substrate for mounting a semiconductor element thereon of the embodiment modes of the present invention, in the case where silver plating layers including a roughened silver plating layer are directly formed on the top faces of the columnar terminal portions without an undercoat plating layer between, the total thickness of the plating layers provided on the top faces of the columnar terminal portions is preferably 0.4 µm or more and 6.0 µm or less. To be specific, it is preferable to form, on outer faces of the sites corresponding to the columnar terminal portions on the upper surface of the metal plate serving as a base material of the substrate for mounting a semiconductor element thereon, a silver strike plating layer with a thickness of 0.2 µm or more and 3.0 µm or less, much preferably 1.5 µm, and thereon to laminate a roughened silver plating layer having acicular projections with a thickness of 0.2 µm or more and 3.0 µm or less, much preferably 0.5 µm.

In the case where a nickel plating layer is provided as an undercoat barrier plating layer, it is preferable that the thickness of the nickel plating layer on the top faces of the columnar terminal portions be 0.3 µm or more and 3.0 µm or less. To be specific, it is preferable to form, on the outer faces of the sites corresponding to the columnar terminal portions on the upper surface of the metal plate, a nickel plating layer with a thickness of 0.3 µm or more and 3.0 µm or less, much preferably 1.0 µm, and thereon to laminate a roughened silver plating layer having acicular projections with a thickness of 0.2 µm or more and 3.0 µm or less, much preferably 0.5 µm.

In the case where a palladium plating layer is provided between the undercoat nickel plating layer and the roughened silver plating layer, the thickness of the palladium plating layer is preferably 0.005 µm or more and 0.1 µm or less. To be specific, it is preferable to form a palladium plating layer with a thickness of 0.005 µm or more and 0.1 µm or less, much preferably 0.01 µm, on the nickel plating layer formed on the outer faces of the sites corresponding to the columnar terminal portions on the upper surface of the metal plate serving as a base material of the substrate for mounting a semiconductor element thereon.

In the case where a gold plating layer is provided between the nickel and palladium undercoat plating layers and the roughened silver plating layer, the thickness of the gold plating layer is preferably 0.0005 µm or more and 0.01 µm or less. To be specific, it is preferable to form a gold plating layer of 0.0005 µm or more and 0.01 µm or less, much preferably 0.001 µm on the nickel and palladium plating layers formed on the outer faces of the sites corresponding to the columnar terminal portions on the upper surface of the metal plate serving as a base material of the substrate for mounting a semiconductor element thereon.

The roughened silver plating layer having acicular projections with a crystal structure in which the crystal direction <101> occupies a largest proportion among the crystal directions <001>, <111> and <101> in the substrate for mounting a semiconductor element thereon according to the embodiment modes of the present invention can be obtained by plating upon use of a silver plating bath having a silver concentration of 1.0 g/L or more and 10 g/L or less, which is a methanesulfonic acid-based silver plating solution, for 5 to 60 seconds at a temperature of 55° C. or more and 65° C. or less and at a current density of 3 A/dm$^2$ or more and 20 A/dm$^2$ or less.

Therefore, according to the embodiment modes of the present invention, regarding a substrate for mounting a semiconductor element thereon in which silver plating is applied, as an outermost plating, to top faces of columnar terminal portions formed by concavities provided on the upper surface of a metal plate made of a copper-based material, there can be obtained a substrate for mounting a semiconductor element thereon that facilitates thinner design of flip-chip mounted semiconductor package, makes it possible to reduce cost and working time for forming the outer roughened surface to improve productivity while staying the total thickness of plating layers including the roughened silver plating layer to be small, and is capable of achieving remarkably increased adhesion to the sealing resin.

Hereinafter, substrates for mounting semiconductor elements thereon to which the embodiment modes of the present invention are applied and a manufacturing method therefor will be described. The present invention is not limited to the following detailed description unless otherwise specifically limited.

First Embodiment Mode

Figure 1A:
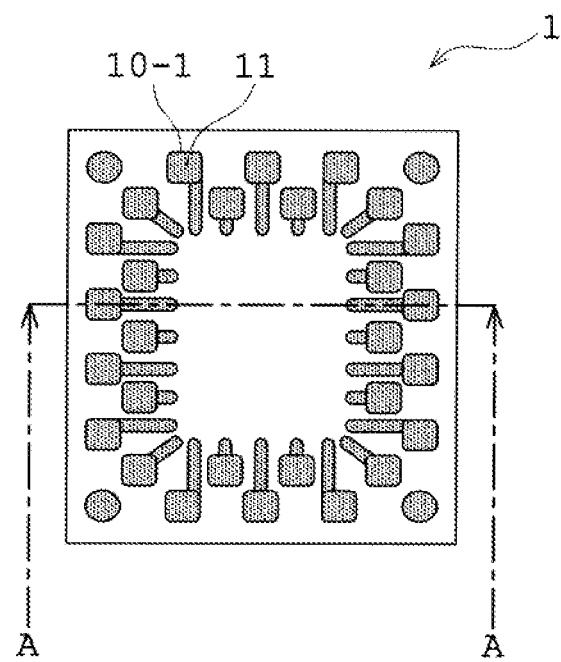
FIGS. 1A-1C are diagrams that show one example of substrate for mounting a semiconductor element thereon according to a first embodiment mode of the present invention, where
Figure 1B:
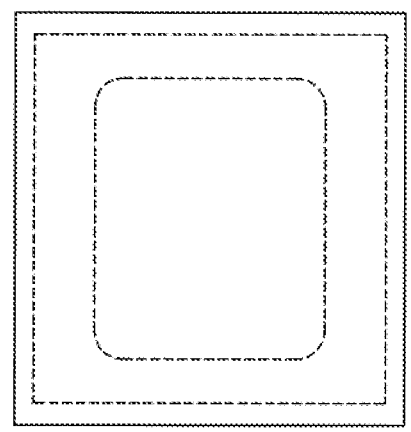
Figure 1C:
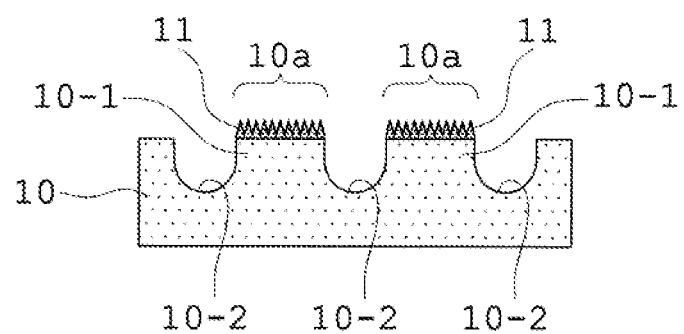
Figure 2:
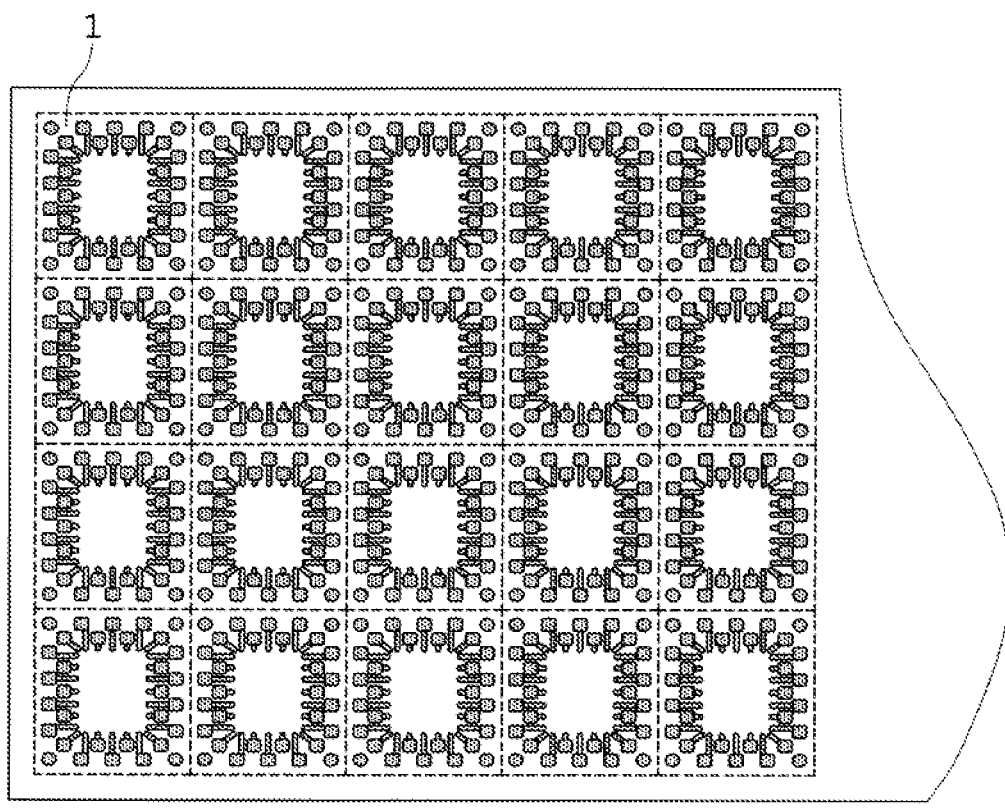
FIG. 2 is a plan view that shows one example of substrates for mounting semiconductor elements thereon arrayed in multiple rows according to the first embodiment mode of the present invention.

FIGS. 1A-1C are diagrams that show one example of substrate for mounting a semiconductor element thereon according to a first embodiment mode of the present invention, where FIG. 1A is a top view, FIG. 1B is a bottom view and FIG. 1C is an explanatory diagram schematically showing the A-A cross section in FIG. 1A. FIG. 2 is a plan view that shows one example of substrates for mounting semiconductor elements thereon arrayed in multiple rows according to the first embodiment mode of the present invention. FIGS. 3A-3I are explanatory diagrams that show one example of manufacturing procedure for the substrate for mounting a semiconductor element thereon according to the first embodiment mode of the present invention. FIGS. 4A-4F are explanatory diagrams that show one example of manufacturing procedure for a semiconductor package using the substrate for mounting a semiconductor element thereon according to the first embodiment mode of the present invention.

As shown in FIG. 1A, a substrate 1 for mounting a semiconductor element thereon of this embodiment mode is provided with a plurality of columnar terminal portions 10-1 extending from four sides toward a site on which a semiconductor element is to be mounted, and, as shown in FIG. 1C, a roughened silver plating layer 11 is provided as an outermost plating layer on top faces of the columnar terminal portions 10-1. The columnar terminal portions 10-1 are formed by concavities 10-2 provided on the upper surface of a metal plate 10 formed of a copper-based material. In FIG. 1C, the reference numeral 10a denotes internal connection terminal portions to be electrically connected with the semiconductor element.

The roughened silver plating layer 11 has acicular projections having a surface area ratio of 1.30 or more and 6.00 or less (i.e. the ratio of the surface area of the roughened silver plating layer to the surface area of the corresponding smooth surface).

The roughened silver plating layer 11 has a crystal structure in which the crystal direction <101> occupies a largest proportion among the crystal directions <001>, <111> and <101>.

The average diameter of crystal grains in the roughened silver plating layer 11 is smaller than 0.28 µm.

In this embodiment mode, the roughened silver plating layer 11 is formed to have a thickness of 0.2 µm or more and 3.0 µm or less on, as a base, the columnar terminal portions 10-1 formed at the metal plate 10 made of a copper-based material.

As a modification of this embodiment mode, between the columnar terminal portions 10-1 formed at the metal plate 10 made of a copper-based material and the roughened silver plating layer 11, an undercoat plating layer may be provided, to function as a barrier plating layer for preventing copper from diffusing under a high temperature. In this case, the undercoat plating layer can be composed of any of a nickel plating layer, nickel/palladium plating layers and nickel/palladium/gold plating layers, and the roughened silver plating layer 11 is preferably formed to have a thickness of 0.2 µm or more and 3.0 µm or less.

To be specific, in an exemplary case where an undercoat plating layer, which functions as a barrier plating layer for preventing diffusion of copper when electrical connection with a semiconductor element is made via solder, is composed of nickel/palladium plating layers or nickel/palladium/gold plating layers, the roughened silver plating layer 11 is preferably formed to have a thickness of 0.2 µm or more and 3.0 µm or less.

The substrate 1 for mounting a semiconductor element thereon of this embodiment mode is configured so that, as shown in FIG. 2, the individual substrates 1 for mounting semiconductor elements thereon are arrayed in multiple rows.

Next, an example of manufacturing procedure for the substrate 1 for mounting a semiconductor element thereon of this embodiment mode will be described in reference to FIGS. 3A-3I.

Figure 3A:
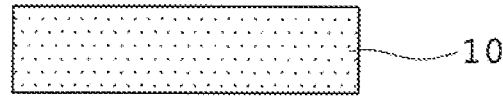
FIGS. 3A-3I are explanatory diagrams that show one example of manufacturing procedure for the substrate for mounting a semiconductor element thereon according to the first embodiment mode of the present invention.

First, a metal plate 10 made of a copper-based material is prepared as a base material of the substrate for mounting a semiconductor element (See FIG. 3A).

Figure 3B:
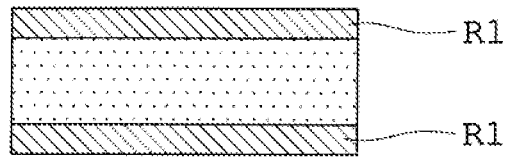

Then, first resist layers R1 are formed on both surfaces of the metal plate 10 (See FIG. 3B).

Figure 3C:
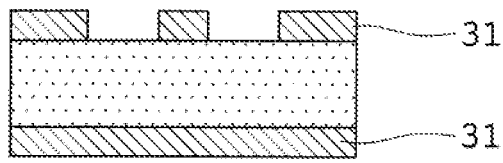

Then, the first resist layer R1 on the upper surface side of the metal plate 10 is exposed and developed upon use of a glass mask carrying a predetermined pattern corresponding to columnar terminal portions 10-1 as well as the entire region of the first resist layer R1 on the lower surface side of the metal plate 10 is exposed and developed, to form plating resist masks 31 having openings at sites corresponding to the columnar terminal portions 10-1 on the upper surface side of the metal plate 10 and covering the entire region on the lower surface side of the metal plate 10 (See FIG. 3C).

Figure 3D:
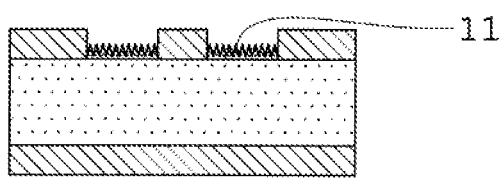
Figure 3E:
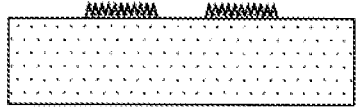

Then, upon use of the plating resist masks 31, a roughened silver plating layer 11 having acicular projections is formed as an outermost plating layer on the upper surface of the metal plate 10 at the sites corresponding to the columnar terminal portions (See FIG. 3D).

Figure 3F:
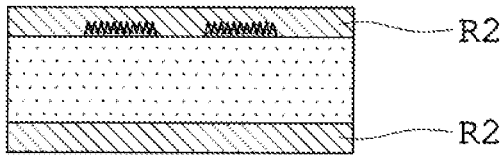

Then, the plating resist masks 31 are removed (See FIG. 3E) and second resist layers R2 are formed on the both sides of the metal plate 10 (See FIG. 3F).

Figure 3G:
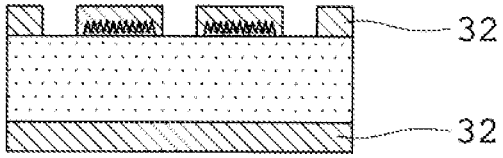

Then, the second resist layer R2 on the upper surface side of the metal plate 10 is exposed and developed upon use of a glass mask carrying a predetermined pattern corresponding to columnar terminal portions 10-1 as well as the entire region of the second resist layer R2 on the lower surface side of the metal plate 10 is exposed and developed, to form etching resist masks 32 covering the columnar terminal portions 10-1 and having openings at sites corresponding to concavities 10-2 on the upper surface side of the metal plate 10 and covering the entire region on the lower surface side of the metal plate 10 (See FIG. 3G).

Figure 3H:
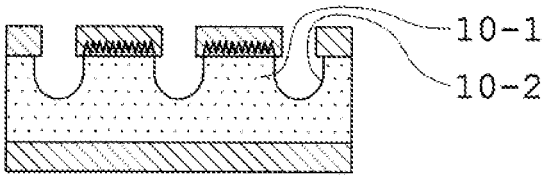

Then, half-etching is performed on the upper surface, to form the columnar terminal portions 10-1 and the concavities 10-2 (See FIG. 3H).

Figure 3I:
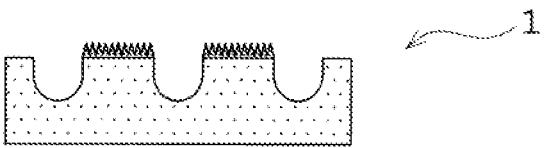

Then, the etching resist masks 32 are removed (See FIG. 3I).

Thereby, the substrate 1 for mounting a semiconductor element thereon of this embodiment mode is completed.

Regarding the process of forming the roughened silver plating layer 11 having acicular projections as the outermost plating layer, the roughened silver plating layer is formed only upon activation treatment on outer faces of the sites corresponding to the columnar terminal portions 10-1 on the upper surface of the metal plate 10 serving as a base material of the substrate for mounting a semiconductor element thereon or the roughened silver plating layer 11 is formed on a thin and smooth nickel plating layer formed as a barrier plating layer to a thickness as to prevent diffusion of the underlying copper. In the case where adhesiveness of the roughened silver plating layer 11 is unreliable, a silver strike plating layer may be formed directly before roughened silver plating, so that the roughened silver plating layer 11 is formed thereon.

In order to form the roughened silver plating layer 11 having acicular projections with a surface area ratio (i.e. the ratio of the surface area of the roughened silver plating layer to the surface area of a corresponding smooth surface) of 1.30 or more and 6.00 or less and with a crystal structure in which the crystal direction <101> occupies a largest proportion among the crystal directions <001>, <111> and <101>, the silver concentration in a silver plating bath composed of a methanesulfonic acid-based silver plating solution is set in the range of 1.0 g/L or more and 10 g/L or less. In particular, it is much preferable that the silver concentration is in the range of 1.5 g/L or more and 5.0 g/L or less.

A silver concentration lower than 1.0 g/L is not preferable because the roughened silver plating film cannot be formed sufficiently. A silver concentration higher than 10 g/L causes the film of the roughened silver plating layer to have a smooth surface, or fails to form acicular silver crystals, and thus is not preferable.

As an alternative to the silver strike plating used to improve bondability between the base and the roughened silver plating layer 11, a plating layer of palladium or of an alloy containing palladium may be used to suitably bond the base and the roughened silver plating layer 11.

Further, a plating layer of gold or of an alloy containing gold may be formed under the roughened silver plating layer 11 in order to improve bondability to a semiconductor element.

In the case where the roughened silver plating layer 11 is formed directly on the sites corresponding to the columnar terminal portions 10-1 on the upper surface of the metal plate 10 without an undercoat plating layer between, the thickness of the roughened silver plating layer 11 needs to be 0.2 µm or more, and is preferably 0.2 µm or more and 3.0 µm or less. Further, from the viewpoint of cost, it is much preferable that the thickness is 0.3 µm or more and 1.0 µm or less.

In the case where plating layers composed of nickel/palladium plating or plating layers composed of nickel/palladium/gold plating are provided as undercoat plating layers functioning as a barrier for preventing copper diffusion when electrical connection with a semiconductor element is made via solder, the thickness of the roughened silver plating layer 11 is preferably 0.2 µm or more and 3.0 µm or less.

Next, an example of manufacturing procedure for a semiconductor package using the substrate 1 for mounting a semiconductor element thereon of this embodiment mode will be described in reference to FIGS. 4A-4F.

Figure 4A:
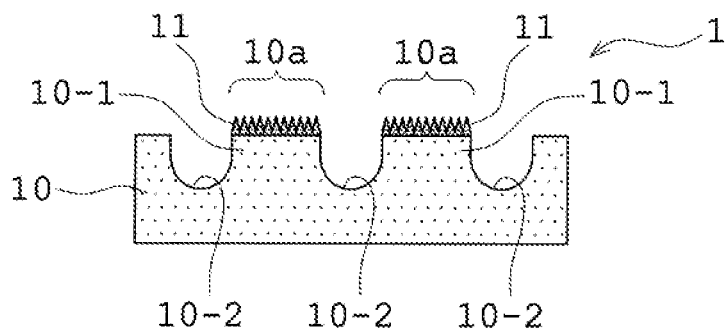
FIGS. 4A-4F are explanatory diagrams that show one example of manufacturing procedure for a semiconductor package using the substrate for mounting a semiconductor element thereon according to the first embodiment mode of the present invention.

First, the substrate 1 for mounting a semiconductor element thereon manufactured in accordance with the manufacturing procedure shown in FIGS. 3A-3I is prepared (See FIG. 4A).

Figure 4B:
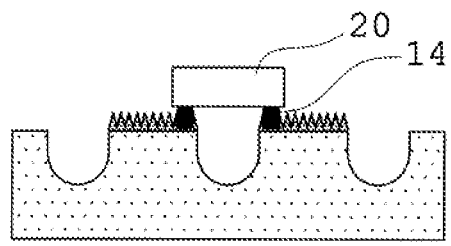

Then, solder 14 is printed on the site for mounting a semiconductor element thereon in the internal connection terminal portions 10a on the top faces of the columnar terminal portions 10-1 of the substrate for mounting a semiconductor element thereon, and a semiconductor element 20 is mounted thereon and fixed, so that electrodes of the semiconductor element 20 and the internal connection terminal portions 10a of the substrate 1 for mounting a semiconductor element thereon are electrically connected (See FIG. 4B).

Figure 4C:
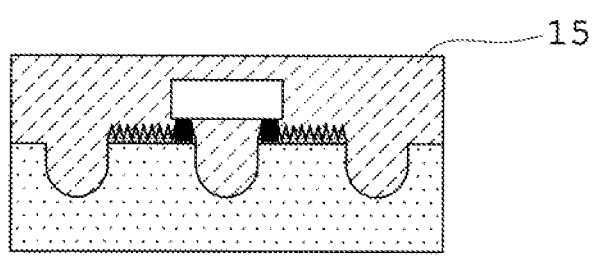

Then, a mold is used to seal, with sealing resin 15, a surrounding space region on the upper surface side of the substrate 1 for mounting a semiconductor element thereon (See FIG. 4C).

Figure 4D:
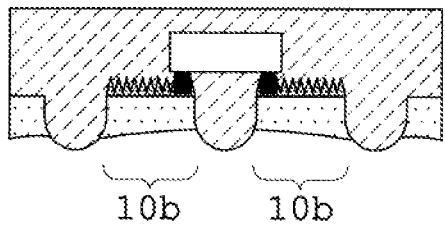

Then, half-etching is performed on the lower surface side of the metal plate 10, to isolate the columnar terminal portions 10-1 (See FIG. 4D).

Figure 4E:
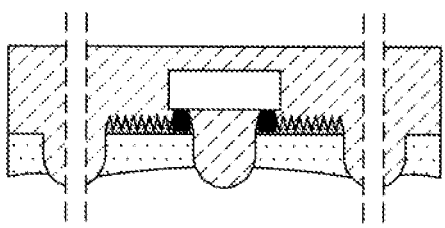

Lastly, semiconductor packages arrayed in multiple rows are singulated by dicing, pressing or the like (See FIG. 4E).

Figure 4F:
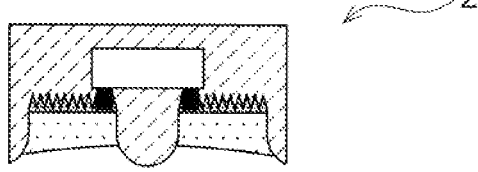

Thereby, a semiconductor package 2 using the substrate 1 for mounting a semiconductor element thereon of this embodiment mode is obtained (See FIG. 4F).

Second Embodiment Mode

Figure 5A:
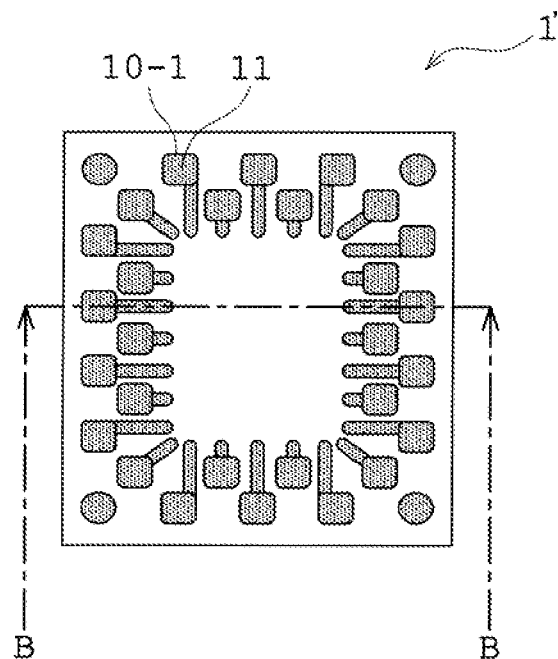
FIGS. 5A-5C are diagrams that show one example of substrate for mounting a semiconductor element thereon according to a second embodiment mode of the present invention, where
Figure 5B:
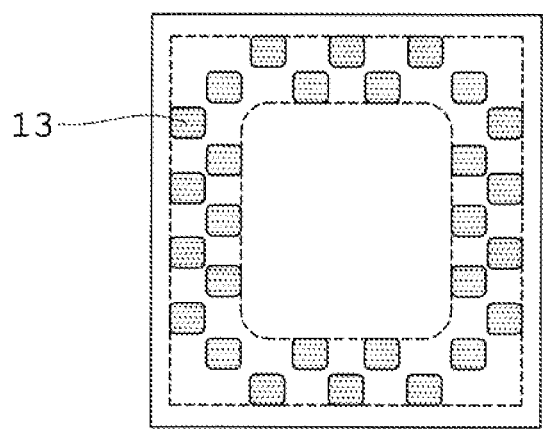
Figure 5C:
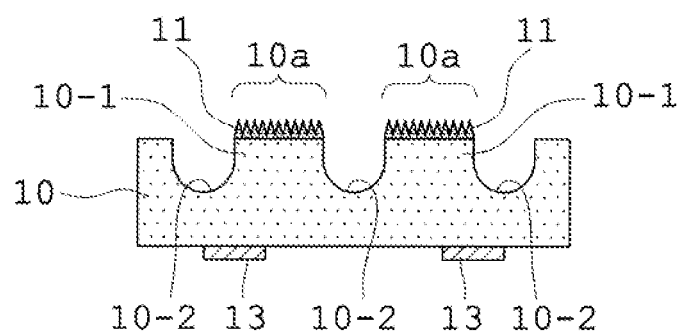

FIGS. 5A-5C are diagrams that show one example of substrate for mounting a semiconductor element thereon according to a second embodiment mode of the present invention, where FIG. 5A is a top view, FIG. 5B is a bottom view and FIG. 5C is an explanatory diagram schematically showing a B-B cross section in FIG. 5A. FIGS. 6A-6M are explanatory diagrams that show one example of manufacturing procedure for the substrate for mounting a semiconductor element thereon according to the second embodiment mode of the present invention. FIGS. 7A-7F are explanatory diagrams that show one example of manufacturing procedure for a semiconductor package using the substrate for mounting a semiconductor element thereon according to the second embodiment mode of the present invention.

As shown in FIG. 5B and FIG. 5C, in a substrate 1' for mounting a semiconductor element thereon according this embodiment mode, at positions corresponding to external connection terminal portions 10b on the lower surface of a metal plate 10, a plating layer 13 for external connection is formed. The remaining configurations are substantially the same as in the substrate 1 for mounting a semiconductor element thereon of the first embodiment mode.

Next, an example of manufacturing procedure for the substrate 1' for mounting a semiconductor element thereon of this embodiment mode will be described in reference to FIGS. 6A-6M.

Figure 6A:
FIGS. 6A-6M are explanatory diagrams that show one example of manufacturing procedure for the substrate for mounting a semiconductor element thereon according to the second embodiment mode of the present invention.

First, a metal plate 10 made of a copper-based material is prepared as a base material of the substrate for mounting a semiconductor element (See FIG. 6A).

Figure 6B:
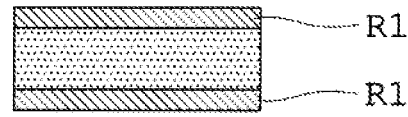

Then, first resist layers R1 are formed on both surfaces of the metal plate 10 (See FIG. 6B).

Figure 6C:
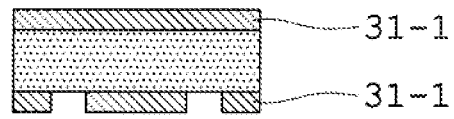

Then, the entire region of the first resist layer R1 on the upper surface side of the metal plate 10 is exposed and developed as well as the first resist layer R1 on the lower surface side of the metal plate 10 is exposed and developed upon use of a glass mask carrying a predetermined pattern corresponding to external connection terminal portions 10b, to form first plating resist masks 31-1 covering the entire region on the upper surface side of the metal plate 10 and having openings at sites corresponding to the external connection terminal portions 10b on the lower surface side of the metal plate 10 (See FIG. 6C).

Figure 6D:
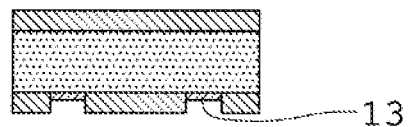
Figure 6E:

Then, upon use of the first plating resist masks 31-1, a nickel plating layer having a thickness of 0.3 to 3 μm, a palladium plating layer having a thickness of 0.005 to 0.1 μm, and a gold plating layer having a thickness of 0.0005 to 0.1 μm are laminated in this order on the lower surface of the metal plate 10 at the sites corresponding to the external connection terminal portions 10b, to form a plating layer 13 for external connection (See FIG. 6D).

Figure 6F:
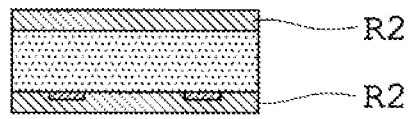

Then, the first plating resist masks 31-1 are removed (See FIG. 6E), and second resist layers R2 are formed on the both sides of the metal plate 10 (See FIG. 6F).

Figure 6G:
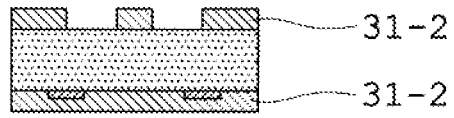

Then, the second resist layer R2 on the upper surface side of the metal plate 10 is exposed and developed upon use of a glass mask carrying a predetermined pattern corresponding to internal connection terminal portions 10a as well as the entire region of the second resist layer R2 on the lower surface side of the metal plate 10 is exposed and developed, to form second plating resist masks 31-2 having openings at sites corresponding to the internal connection terminal portions 10a on the upper surface side of the metal plate 10 and covering the entire region on the lower surface side of the metal plate 10 (See FIG. 6G).

Figure 6H:
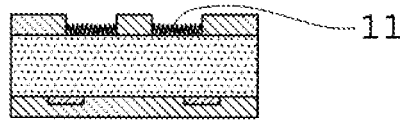
Figure 6I:
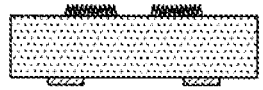

Then, upon use of the second plating resist masks 31-2, a roughened silver plating layer 11 having acicular projections is formed as an outermost plating layer on the upper surface of the metal plate 10 at the sites corresponding to the internal connection terminal portions 10a (See FIG. 6H).

Figure 6J:
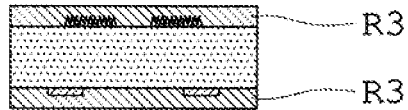

Then, the second plating resist masks 31-2 are removed (See FIG. 6I), and third resist layers R3 are formed on the both sides of the metal plate 10 (See FIG. 6J).

Figure 6K:
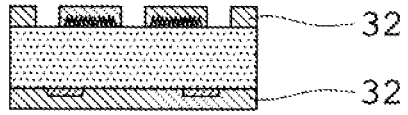

Then, the third resist layer R3 on the upper surface side of the metal plate 10 is exposed and developed upon use of a glass mask carrying a predetermined pattern corresponding to columnar terminal portions 10-1 as well as the entire region of the third resist layer R3 on the lower surface side of the metal plate 10 is exposed and developed, to form etching resist masks 32 covering the columnar terminal portions 10-1 and having openings at sites corresponding to concavities 10-2 on the upper surface side of the metal plate 10 and covering the entire region on the lower surface side of the metal plate 10 (See FIG. 6K).

Figure 6L:
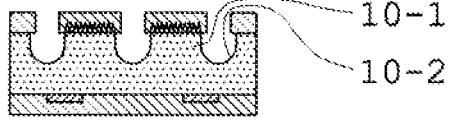

Then, half-etching is performed on the upper surface, to form the columnar terminal portions 10-1 and the concavities 10-2 (See FIG. 6L).

Figure 6M:
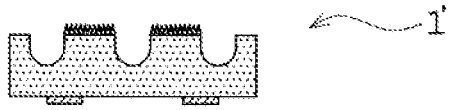

Then, the etching resist masks 32 are removed (See FIG. 6M).

Thereby, the substrate 1' for mounting a semiconductor element thereon of the second embodiment mode is completed.

The technique of forming a roughened silver plating layer 11 having acicular projections as the outermost plating layer is substantially the same as in the manufacturing procedure for the substrate for mounting a semiconductor element thereon of the first embodiment mode.

Next, an example of manufacturing procedure for a semiconductor package using the substrate 1' for mounting a semiconductor element thereon of the second embodiment mode will be described in reference to FIGS. 7A-7F.

First, from preparation of the substrate 1' for mounting a semiconductor element thereon (See FIG. 7A), mounting of the semiconductor element 20 (See FIG. 7B) through formation of sealing resin upon use of mold (See FIG. 7C), the manufacturing procedure is substantially the same as that for a semiconductor package using the substrate 1 for mounting a semiconductor element thereon of the first embodiment mode (See FIGS. 4A-4C).

Figure 7A:
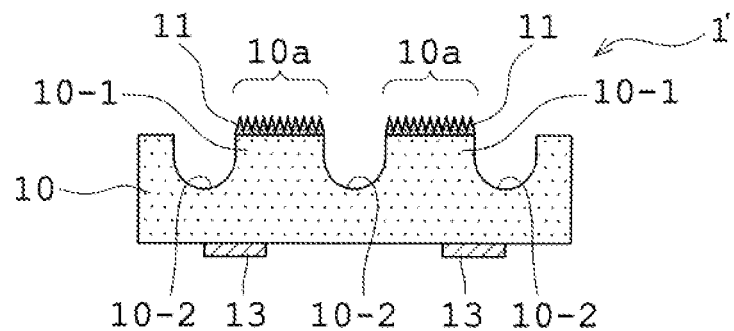
FIGS. 7A-7F are explanatory diagrams that show one example of manufacturing procedure for a semiconductor package using the substrate for mounting a semiconductor element thereon according to the second embodiment mode of the present invention.
Figure 7B:
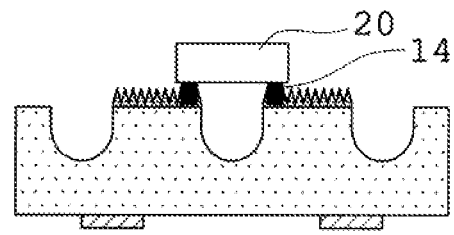
Figure 7C:
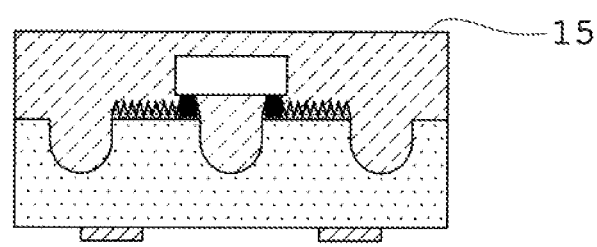
Figure 7D:
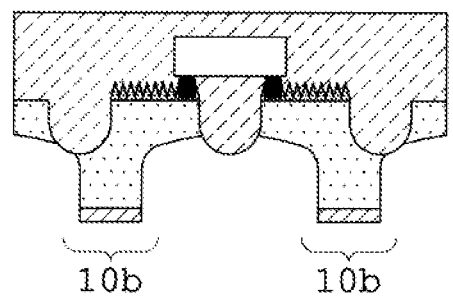

Then, half-etching is performed on the lower surface side upon use of the plating layer 13 for external connection as an etching mask, to form the external connection terminal portions 10b (See FIG. 7D).

Figure 7E:
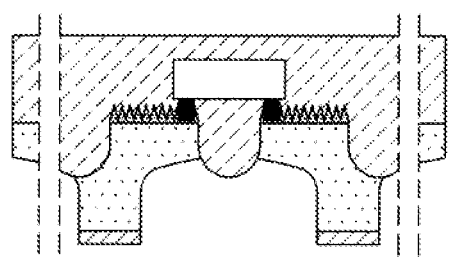

Lastly, semiconductor packages arrayed in multiple rows are singulated by dicing, pressing or the like (See FIG. 7E).

Figure 7F:
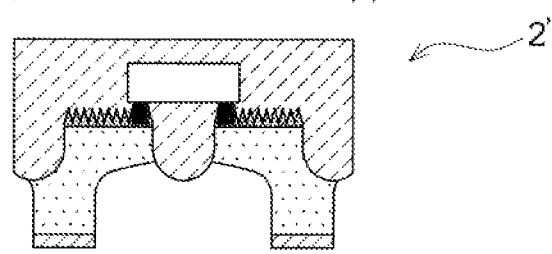

Thereby, a semiconductor package 2' using the substrate 1 for mounting a semiconductor element thereon of this embodiment mode is obtained (See FIG. 7F).

Third Embodiment Mode

Figure 8A:
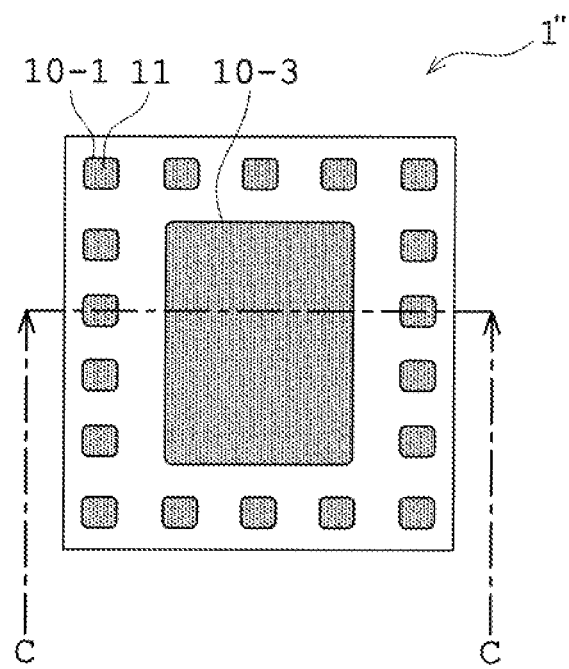
FIGS. 8A-8C are diagrams that show one example of substrate for mounting a semiconductor element thereon according to a third embodiment mode of the present invention, where
Figure 8B:
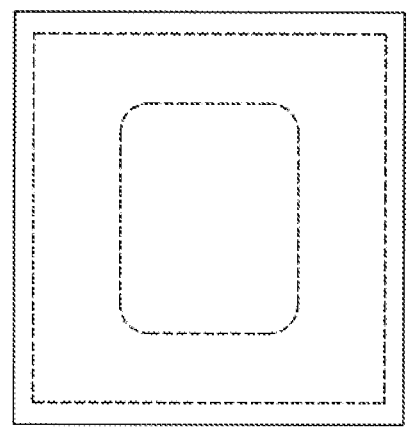
Figure 8C:
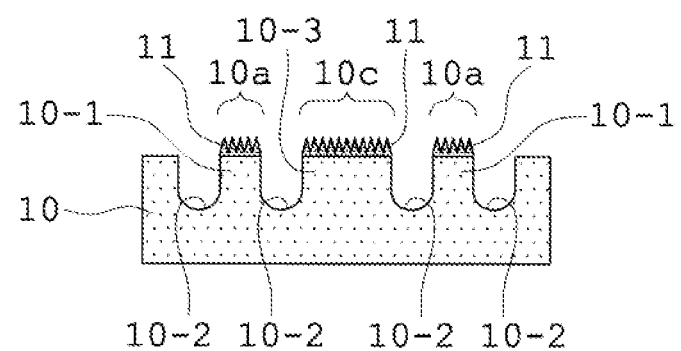
Figure 9:
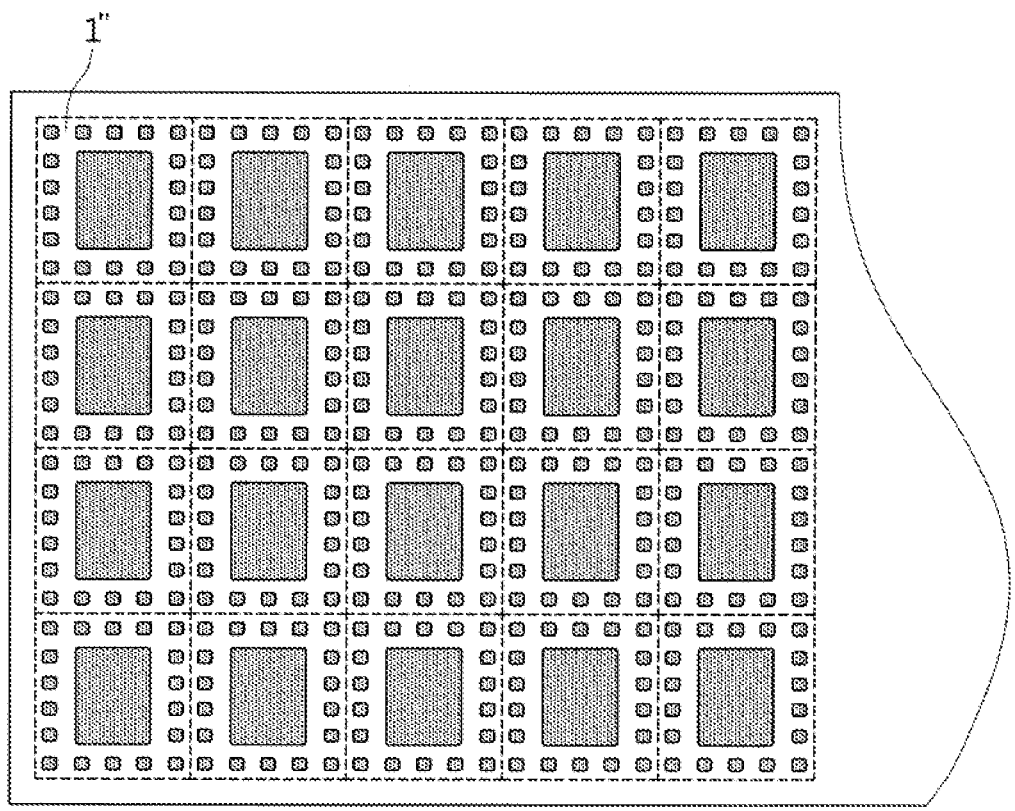
FIG. 9 is a plan view that shows one example of substrates for mounting semiconductor elements thereon arrayed in multiple rows according to the third embodiment mode of the present invention.
Figure 10A:
FIGS. 10A-10I are explanatory diagrams that show one example of manufacturing procedure for the substrate for mounting a semiconductor element thereon according to the third embodiment mode of the present invention.
Figure 10B:
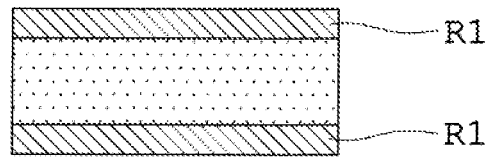
Figure 10C:
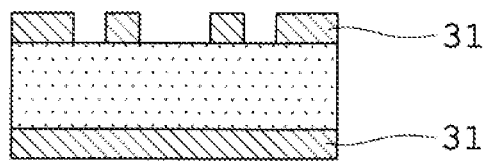
Figure 10D:
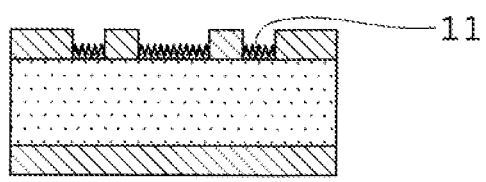
Figure 10E:
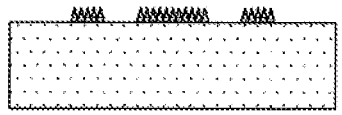
Figure 10F:
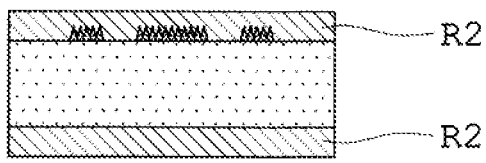
Figure 10G:
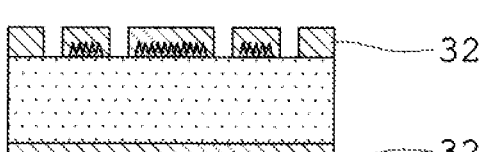
Figure 10H:
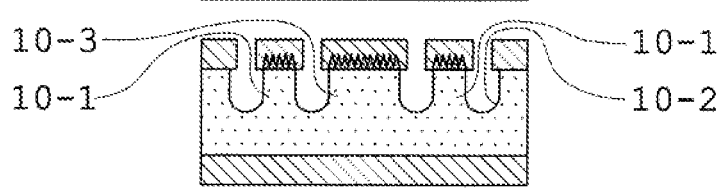
Figure 10I:
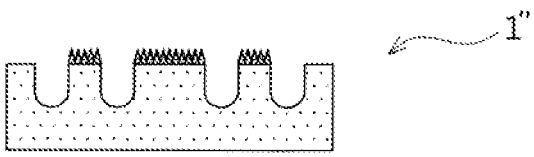

FIGS. 8A-8C are diagrams that show one example of substrate for mounting a semiconductor element thereon according to a third embodiment mode of the present invention, where FIG. 8A is a top view, FIG. 8B is a bottom view and FIG. 8C is an explanatory diagram schematically showing the C-C cross section in FIG. 8A. FIG. 9 is a plan view that shows one example of substrates for mounting semiconductor elements thereon arrayed in multiple rows according to the third embodiment mode of the present invention. FIGS. 10A-10I are explanatory diagrams that show one example of manufacturing procedure for the substrate for mounting a semiconductor element thereon according to the third embodiment mode of the present invention. FIGS. 11A-11F are explanatory diagrams that show one example of manufacturing procedure for a semiconductor package using the substrate for mounting a semiconductor element thereon according to the third embodiment mode of the present invention.

A substrate 1" for mounting a semiconductor element thereon of this embodiment mode is provided with a columnar terminal portion 10-3 with a large area arranged at the center position and a plurality of columnar terminal portions 10-1 with small areas arrayed along four sides around the columnar terminal portion 10-3 as shown in FIG. 8A, and is provided with a roughened silver plating layer 11, as an outermost plating layer, on top faces of the columnar terminal portions 10-1 and 10-3 as shown in FIG. 8C. The columnar terminal portion 10-3 is configured, at the top face thereof, as a pad portion 10c on which a semiconductor element is to be mounted, and the columnar terminal portions 10-1 are configured, at the top faces thereof, as internal connection terminal portions 10a to be electrically connected with a semiconductor element via bonding wires.

The roughened silver plating layer 11 has acicular projections having a surface area ratio of 1.30 or more and 6.00 or less (i.e. the ratio of the surface area of the roughened silver plating layer to the surface area of the corresponding smooth surface).

The roughened silver plating layer 11 has a crystal structure in which the crystal direction <101> occupies a largest proportion among the crystal directions <001>, <111> and <101>.

The average diameter of crystal grains in the roughened silver plating layer 11 is smaller than 0.28 μm.

In this embodiment mode, the roughened silver plating layer 11 is formed to have a thickness of 0.2 µm or more and 3.0 µm or less on, as a base, the columnar terminal portions 10-1 formed at the metal plate 10 made of a copper-based material.

As a modification of this embodiment mode, between the columnar terminal portions 10-1 formed at the metal plate 10 made of a copper-based material and the roughened silver plating layer 11, an undercoat plating layer may be provided, to function as a barrier plating layer for preventing copper from diffusing under a high temperature. In this case, the undercoat plating layer can be composed of any of a nickel plating layer, nickel/palladium plating layers and nickel/palladium/gold plating layers, and the roughened silver plating layer 11 is preferably formed to have a thickness of 0.2 µm or more and 3.0 µm or less.

To be specific, in an exemplary case where an undercoat plating layer, which functions as a barrier plating layer for preventing diffusion of copper when electrical connection with a semiconductor element is made by wire-bonding method, is composed of a nickel plating layer, the roughened silver plating layer 11 is preferably formed to have a thickness of 0.2 µm or more and 3.0 µm or less.

In a case where an undercoat plating layer, which functions as a barrier plating layer for preventing diffusion of copper when electrical connection with a semiconductor element is made by wire-bonding method, is composed of nickel/palladium plating layers, the roughened silver plating layer 11 is preferably formed to have a thickness of 0.2 µm or more and 3.0 µm or less.

The substrate 1" for mounting a semiconductor element thereon of this embodiment mode is configured so that, as shown in FIG. 9, the individual substrates 1" for mounting semiconductor elements thereon are arrayed in multiple rows.

Next, an example of manufacturing procedure for the substrate 1" for mounting a semiconductor element thereon of this embodiment mode will be described in reference to FIGS. 10A-10I.

The manufacturing procedure for the substrate 1" for mounting a semiconductor element thereon of this embodiment mode is substantially the same as the manufacturing procedure for the substrate 1 for mounting a semiconductor element thereon of the first embodiment mode shown in FIGS. 3A-3I, and the process of forming the roughened silver plating layer 11 having acicular projections as an outermost plating layer also is substantially the same as that in the substrate 1 for mounting a semiconductor element thereon of the first embodiment mode (See FIG. 10A through FIG. 10I).

In the case where the roughened silver plating layer 11 is formed directly on the top faces of the columnar terminal portions without an undercoat plating layer between, the thickness of the roughened silver plating layer 11 needs to be 0.2 µm or more, and preferably is 0.2 µm or more and 3.0 µm or less. Further, from the viewpoint of cost, it is much preferable that the thickness is 0.3 µm or more and 1.0 µm or less.

In the case where a nickel plating layer is provided as an undercoat plating layer functioning as a barrier for preventing copper diffusion when electrical connection with a semiconductor element is made by wire-bonding method, the thickness of the roughened silver plating layer 11 is preferably 0.2 µm or more and 3.0 µm or less.

In the case where nickel/palladium plating layers are provided as undercoat plating layers functioning as a barrier for preventing copper diffusion when electrical connection with a semiconductor element is made by wire-bonding method, the thickness of the roughened silver plating layer 11 is preferably 0.2 µm or more and 3.0 µm or less.

Next, an example of manufacturing procedure for a semiconductor package using the substrate 1" for mounting a semiconductor element thereon of this embodiment mode will be described in reference to FIGS. 11A-11F.

Figure 11A:
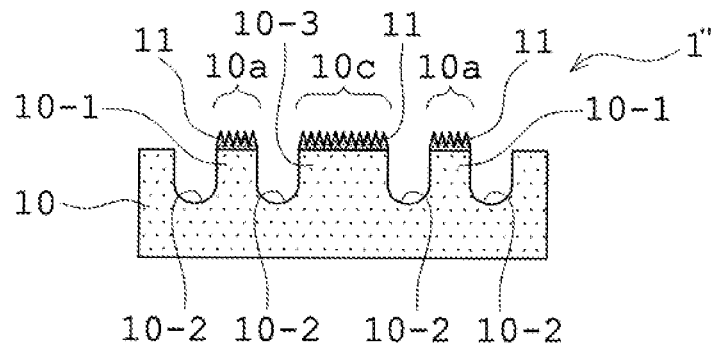
FIGS. 11A-11F are explanatory diagrams that show one example of manufacturing procedure for a semiconductor package using the substrate for mounting a semiconductor element thereon according to the third embodiment mode of the present invention.

First, the substrate" 1 for mounting a semiconductor element thereon manufactured in accordance with the manufacturing procedure shown in FIGS. 10A-10I is prepared (See FIG. 11A).

Figure 11B:
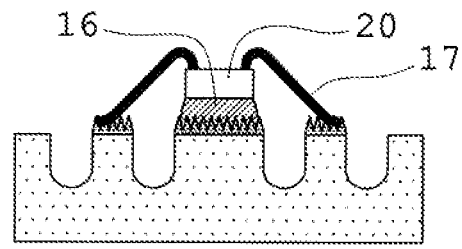

Then, a semiconductor element 20 is mounted and fixed on the pad portion 10c of the columnar terminal portion 10-3 on the upper surface side of the substrate 1" for mounting a semiconductor element thereon via die bond 16, and electrodes of the semiconductor element 20 and the internal connection terminal portions 10a of the columnar terminal portions 10-1 are electrically connected via bonding wires 17 (See FIG. 11B).

Figure 11C:
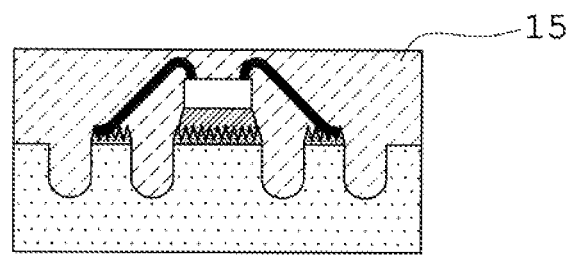

Then, a mold is used to seal, with sealing resin 15, a surrounding space region on the upper surface side of the substrate 1" for mounting a semiconductor element thereon (See FIG. 11C).

Figure 11D:
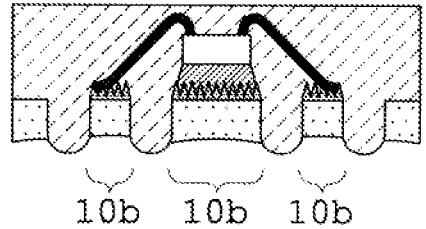

Then, half-etching is performed on the lower surface side of the metal plate 10, to isolate the columnar terminal portions 10-1 and 10-3 (See FIG. 11D).

Figure 11E:
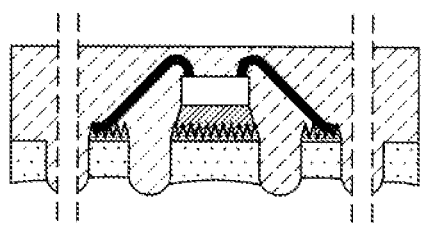

Lastly, semiconductor packages arrayed in multiple rows are singulated by dicing, pressing or the like (See FIG. 11E).

Figure 11F:
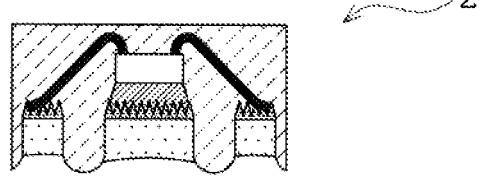

Thereby, a semiconductor package 2" using the substrate 1" for mounting a semiconductor element thereon of this embodiment mode is obtained (See FIG. 11F).

Fourth Embodiment Mode

Figure 12A:
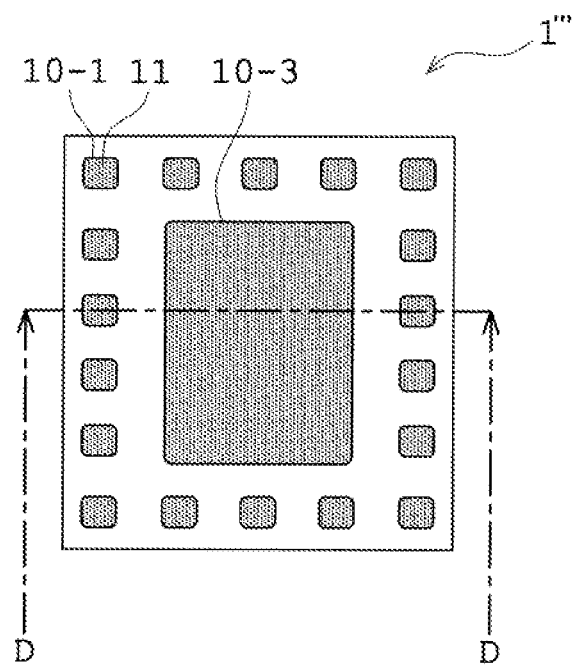
FIGS. 12A-12C are diagrams that show one example of substrate for mounting a semiconductor element thereon according to a fourth embodiment mode of the present invention, where
Figure 12B:
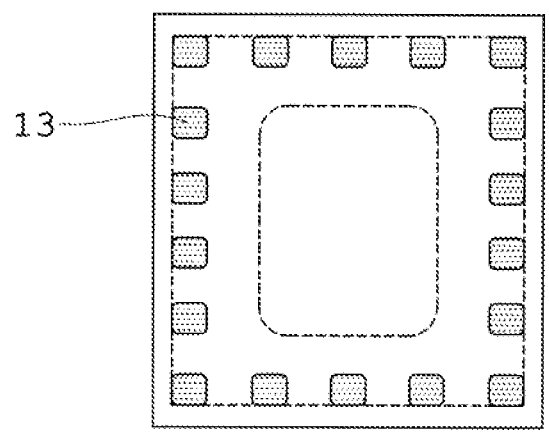
Figure 12C:
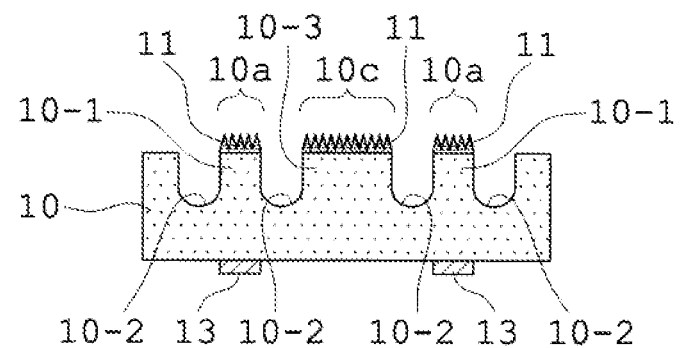
Figure 13A:
FIGS. 13A-13M are explanatory diagrams that show one example of manufacturing procedure for the substrate for mounting a semiconductor element thereon according to the fourth embodiment mode of the present invention.
Figure 13B:
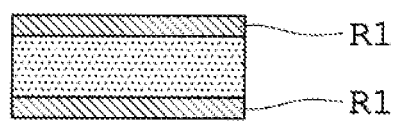
Figure 13C:
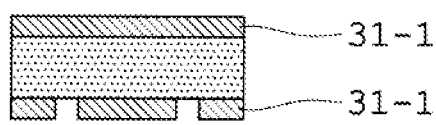
Figure 13D:
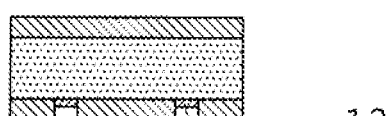
Figure 13E:
Figure 13F:
Figure 13G:
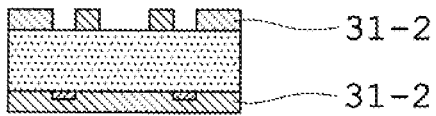
Figure 13H:
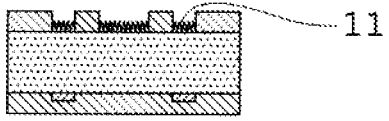
Figure 13I:
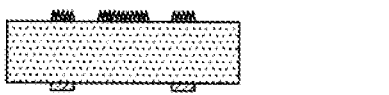
Figure 13J:
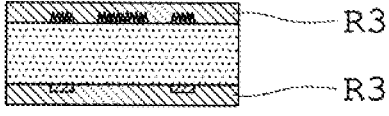
Figure 13K:
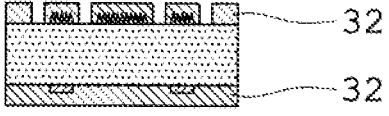
Figure 13L:
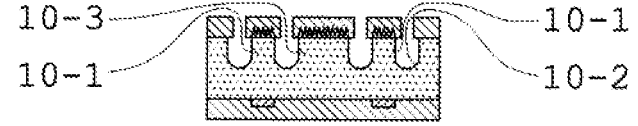
Figure 13M:

FIGS. 12A-12C are diagrams that show one example of substrate for mounting a semiconductor element thereon according to a fourth embodiment mode of the present invention, where FIG. 12A is a top view, FIG. 12B is a bottom view and FIG. 12C is an explanatory diagram schematically showing a D-D cross section in FIG. 12A. FIGS. 13A-13M are explanatory diagrams that show one example of manufacturing procedure for the substrate for mounting a semiconductor element thereon according to the fourth embodiment mode of the present invention. FIGS. 14A-14F are explanatory diagrams that show one example of manufacturing procedure for a semiconductor package using the substrate for mounting a semiconductor element thereon according to the fourth embodiment mode of the present invention.

As shown in FIG. 12B and FIG. 12C, in a substrate 1'" for mounting a semiconductor element thereon according this embodiment mode, at positions corresponding to external connection terminal portions 10b on the lower surface of a metal plate 10, a plating layer 13 for external connection is formed.

The remaining configurations are substantially the same as in the substrate 1" for mounting a semiconductor element thereon of the third embodiment mode.

Next, an example of manufacturing procedure for the substrate 1'" for mounting a semiconductor element thereon of this embodiment mode will be described in reference to FIGS. 13A-13M.

The manufacturing procedure for the substrate 1'" for mounting a semiconductor element thereon of this embodiment mode is substantially the same as the manufacturing procedure for the substrate 1' for mounting a semiconductor element thereon of the second embodiment mode shown in FIGS. 6A-6M, and the process of forming the roughened silver plating layer 11 having acicular projections as an outermost plating layer is substantially the same as that in the substrate 1 for mounting a semiconductor element thereon of the first embodiment mode (See FIG. 13A through FIG. 13M).

In the case where the roughened silver plating layer 11 is formed directly on the top faces of the columnar terminal portions without an undercoat plating layer between, the thickness of the roughened silver plating layer 11 needs to be 0.2 µm or more, and preferably is 0.2 µm or more and 3.0 µm or less. Further, from the viewpoint of cost, it is much preferable that the thickness is 0.3 µm or more and 1.0 µm or less.

In the case where a nickel plating layer is provided as an undercoat plating layer functioning as a barrier for preventing copper diffusion when electrical connection with a semiconductor element is made by wire-bonding method, the thickness of the roughened silver plating layer 11 is preferably 0.2 µm or more and 3.0 µm or less.

In the case where nickel/palladium plating layers are provided as undercoat plating layers functioning as a barrier for preventing copper diffusion when electrical connection with a semiconductor element is made by wire-bonding method, the thickness of the roughened silver plating layer 11 is preferably 0.22 µm or more and 3.0 µm or less.

Next, an example of manufacturing procedure for a semiconductor package using the substrate 1''' for mounting a semiconductor element thereon of the fourth embodiment mode will be described in reference to FIGS. 14A-14F.

First, from preparation of the substrate 1''' for mounting a semiconductor element thereon (See FIG. 14A), mounting of the semiconductor element 20 (See FIG. 14B) through formation of sealing resin upon use of mold (See FIG. 14C), the manufacturing procedure is substantially the same as that for a semiconductor package using the substrate 1" for mounting a semiconductor element thereon of the third embodiment mode (See FIGS. 11A-11C).

Figure 14A:
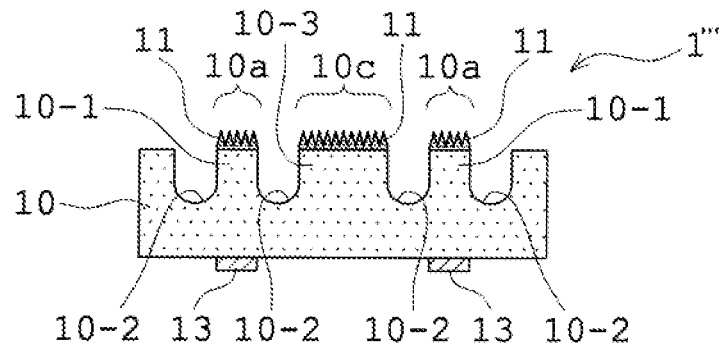
FIGS. 14A-14F are explanatory diagrams that show one example of manufacturing procedure for a semiconductor package using the substrate for mounting a semiconductor element thereon according to the fourth embodiment mode of the present invention.
Figure 14B:
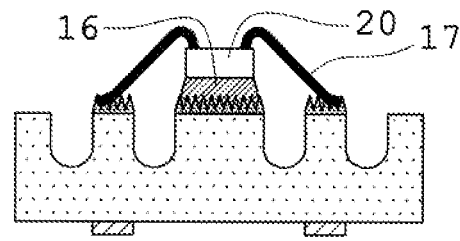
Figure 14C:
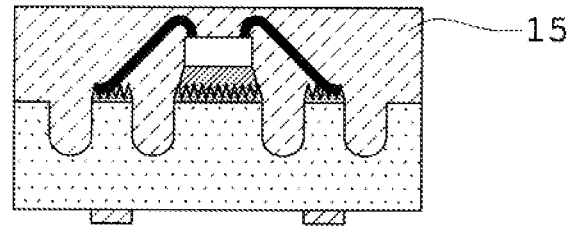
Figure 14D:
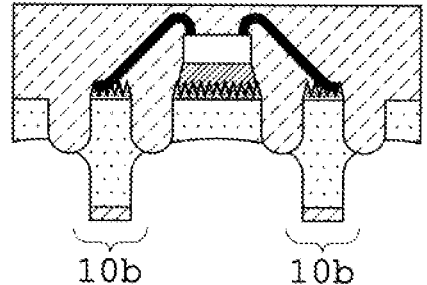

Then, half-etching is performed on the lower surface side upon use of the plating layer 13 for external connection as an etching mask, to form the external connection terminal portions 10b (See FIG. 14D).

Figure 14E:
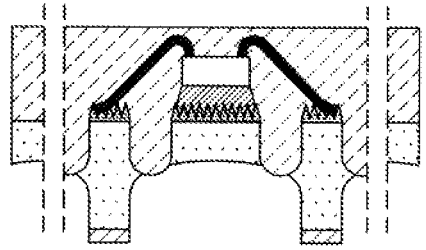

Lastly, semiconductor packages arrayed in multiple rows are singulated by dicing, pressing or the like (See FIG. 14E).

Figure 14F:
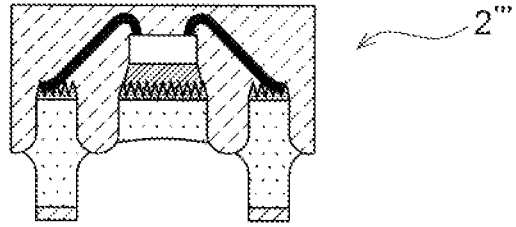

Thereby, a semiconductor package 2''' using the substrate 1''' for mounting a semiconductor element thereon of this embodiment mode is obtained (See FIG. 14F).

Embodied Example 1

A substrate for mounting a semiconductor element thereon of Embodied Example 1 is an example of substrate for mounting a semiconductor element thereon in which the roughened silver plating layer 11 is formed upon use of the columnar terminal portions 10-1 formed on the upper surface side of the base material 10 of the substrate for mounting a semiconductor element thereon as a base, on the top faces of the columnar terminal portions 10-1 without an undercoat plating layer between.

In Embodied Example 1, a strip copper material having a thickness of 0.125 mm and a width of 180 mm was prepared as a base material 10 of a substrate for mounting a semiconductor element thereon (See FIG. 3A), and first resist layers R1 with a thickness of 25 µm were formed on both surfaces of the copper material (See FIG. 3B). Then, the first resist layer R1 on the upper surface side of the metal plate 10 was exposed and developed upon use of a glass mask carrying a predetermined pattern corresponding to columnar terminal portions 10-1 as well as the entire region of the first resist layer R1 on the lower surface side of the metal plate 10 was exposed and developed, to form plating resist masks 31 having openings at sites corresponding to the columnar terminal portions 10-1 on the upper surface side of the metal plate 10 and covering the entire region on the lower surface side of the metal plate 10 (See FIG. 3C).

Then, upon use of the plating resist masks 31, the sites corresponding to the columnar terminal portions 10-1 on the upper surface side of the metal plate 10 were subjected to pretreatment with alkali and acid, and then were electroplated in the following manner.

By use of a silver plating bath with a silver concentration of 3.5 g/L, which was composed of a methanesulfonic acid-based silver plating solution, plating was performed for 45 seconds at a current density of 5 A/dm$^2$ and at a temperature of 60° C., to form a roughened silver plating layer 11 with a thickness of about 1.5 µm (See FIG. 3D) having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value).

Then, the plating resist masks 31 were removed (See FIG. 3E), second resist layers R2 were formed on the both sides of the metal plate 10 (See FIG. 3F), and the second resist layer R2 on the upper surface side of the metal plate 10 was exposed and developed upon use of a glass mask carrying a predetermined pattern corresponding to the columnar terminal portions 10-1 as well as the entire region of the second resist layer R2 on the lower surface side of the metal plate 10 was exposed and developed, to form etching resist masks 32 covering the columnar terminal portions 10-1 and having openings at sites corresponding to concavities 10-2 on the upper surface side of the metal plate 10 and covering the entire region on the lower surface side of the metal plate 10 (See FIG. 3G).

Then, half-etching was performed on the upper surface, to form the columnar terminal portions 10-1 and the concavities 10-2 (See FIG. 3H), and the etching resist masks 32 were removed (See FIG. 3I), thereby to obtain a substrate 1 for mounting a semiconductor element thereon of Embodied Example 1.

Embodied Example 2

A substrate for mounting a semiconductor element thereon of Embodied Example 2 is an example of substrate for mounting a semiconductor element thereon having a structure in which, in consideration of electrical connection to a semiconductor element being made by wire-bonding method (gold wire or copper wire), a nickel plating layer is applied to top faces of the columnar terminal portions 10-1 and 10-3 as an undercoat barrier plating layer for preventing thermal diffusion of copper residing in the columnar terminal portions 10-1 and 10-3.

In Embodied Example 2, up to formation of the plating resist masks 31 (See FIG. 10C) and pretreatment for electroplating at sites corresponding to columnar terminal portions 10-1 and 10-3 on the upper surface side of the metal plate 10, steps were carried out substantially in the same manner as in Embodied Example 1. In the subsequent electroplating treatment, first, by use of a nickel plating bath composed of nickel sulfamate, nickel chloride and boric acid, plating was performed for 1 minute and 30 seconds at a current density of 2 A/dm², to form a nickel plating layer as a smooth undercoat having a thickness of about 1.0 µm. Then, by use of a silver plating bath with a silver concentration of 3.5 g/L, which was composed of a methanesulfonic acid-based silver plating solution, plating was performed for 15 seconds at a current density of 5 A/dm² and at a temperature of 60° C., to form a roughened silver plating layer 11 with a thickness of about 0.5 µm (See FIG. 10D) having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value). After that, the columnar terminal portions 10-1 and 10-3 were formed substantially in the same manner as in Embodied Example 1 (See FIG. 10E through FIG. 10H) and the etching resist masks 32 were removed (See FIG. 10I), thereby to obtain a substrate 1" for mounting a semiconductor element thereon of Embodied Example 2.

Embodied Example 3

A substrate for mounting a semiconductor element thereon of Embodied Example 3 is an example of substrate for mounting a semiconductor element thereon having a structure in which, in consideration of electrical connection to a semiconductor element being made by wire-bonding method (gold wire or copper wire) as in the substrate for mounting a semiconductor element thereon of Embodied Example 2, a nickel plating layer and a palladium plating layer are laminated on top faces of the columnar terminal portions 10-1 and 10-3 as undercoat barrier plating layers for preventing thermal diffusion of copper residing in the columnar terminal portions 10-1 and 10-3.

In Embodied Example 3, up to formation of the nickel plating layer at the sites corresponding to the columnar terminal portions 10-1 and 10-3 on the upper surface side of the metal plate 10 by electroplating treatment, steps were carried out substantially in the same manner as in Embodied Example 2. Then, by use of a palladium plating bath composed of a dichloroamine-based palladium plating solution, plating was performed for 10 seconds at a current density of 2 A/dm², to form a palladium plating layer as a smooth undercoat having a thickness of about 0.01 µm. Then, by use of a silver plating bath with a silver concentration of 3.5 g/L, which was composed of a methanesulfonic acid-based silver plating solution, plating was performed for 15 seconds at a current density of 5 A/dm² and at a temperature of 60° C., to form a roughened silver plating layer 11 with a thickness of about 0.6 µm (See FIG. 10D) having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value). After that, the columnar terminal portions 10-1, 10-3 and concavities 10-2 were formed (See FIG. 10E through FIG. 10H) and the etching resist masks 32 were removed (See FIG. 10I) substantially in the same manner as in Embodied Example 1, thereby to obtain a substrate 1" for mounting a semiconductor element thereon of Embodied Example 3.

Embodied Example 4

A substrate for mounting a semiconductor element thereon of Embodied Example 4 is an example of substrate for mounting a semiconductor element thereon having a structure in which, in consideration of electrical connection to a semiconductor element being made via solder, a silver plating layer is applied, as an undercoat barrier plating, to the top faces of the columnar terminal portions 10-1 for facilitating silver diffusion to solder.

In Embodied Example 4, up to formation of the plating resist masks 31 (See FIG. 3C) and pretreatment for electroplating at the sites corresponding to the columnar terminal portions 10-1 on the upper surface side of the metal plate 10, steps were carried out substantially in the same manner as in Embodied Example 1. In the subsequent electroplating treatment, by use of a silver plating bath composed of a cyan-based silver plating solution, plating was performed for 60 seconds at a current density of 3 A/dm², to form a silver plating layer as a smooth undercoat having a thickness of about 1.1 µm. Then, by use of a silver plating bath with a silver concentration of 3.5 g/L, which was composed of a methanesulfonic acid-based silver plating solution, plating was performed for 15 seconds at a temperature of 60° C. and at a current density of 5 A/dm², to form a roughened silver plating layer 11 with a thickness of about 0.61 µm (See FIG. 3D) having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value). After that, the columnar terminal portions 10-1 and concavities 10-2 were formed substantially in the same manner as in Embodied Example 1 (See FIG. 3E through FIG. 3H) and the etching resist masks 32 were removed (See FIG. 3I), thereby to obtain a substrate 1 for mounting a semiconductor element thereon of Embodied Example 4.

Embodied Example 5

A substrate for mounting a semiconductor element thereon of Embodied Example 5 is an example of substrate for mounting a semiconductor element thereon having a structure in which, in consideration of electrical connection to a semiconductor element being made via solder as in the substrate for mounting a semiconductor element thereon of Embodied Example 4, a nickel plating layer, a palladium plating layer and a gold plating layer are laminated on the top faces of the columnar terminal portions 10-1 as undercoat barrier plating layers for preventing diffusion of copper residing in the columnar terminal portions 10-1.

In Embodied Example 5, up to formation of the palladium plating layer at the sites corresponding to the columnar terminal portions 10-1 on the upper surface side of the metal plate 10 by electroplating treatment, steps were carried out substantially in the same manner as in Embodied Example 3. Then, by use of a gold plating bath composed of a cyan-based gold plating solution, plating was performed for 10 seconds at a current density of 2 A/dm², to form a gold plating layer as a smooth undercoat having a thickness of about 0.001 µm. Then, by use of a silver plating bath with a silver concentration of 3.5 g/L, which was composed of a methanesulfonic acid-based silver plating solution, plating was performed for 15 seconds at a temperature of 60° C. and at a current density of 5 A/dm², to form a roughened silver plating layer 11 with a thickness of about 0.5 µm (See FIG. 3D) having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value). After that, the columnar terminal portions 10-1 and concavities 10-2 were formed substantially in the same manner as in Embodied Example 1 (See FIG. 3E through FIG. 3H) and the etching resist masks 32 were removed (See FIG. 3I), thereby to obtain a substrate 1 for mounting a semiconductor element thereon of Embodied Example 5.

Comparative Example 1

A substrate for mounting a semiconductor element thereon of Comparative Example 1 is an example of substrate for mounting a semiconductor element thereon in which a smooth silver plating layer is formed directly on top faces of columnar terminal portions without an undercoat plating layer between.

In Comparative Example 1, up to formation of plating resist masks and pretreatment for electroplating at sites corresponding to columnar terminal portions on the upper surface side of a metal plate, steps were carried out substantially in the same manner as in Embodied Example 1. In the subsequent electroplating treatment, by use of a silver plating bath with a silver concentration of 65 g/L, which was composed of a cyan-based silver plating solution, plating was performed for 3 minutes at a current density of 3 A/dm$^2$, to form a silver plating layer with a thickness of 2.5 μm and having a smooth surface. After that, columnar terminal portions and concavities were formed substantially in the same manner as in Embodied Example 1 and etching resist masks were removed, thereby to obtain a substrate for mounting a semiconductor element thereon of Comparative Example 1.

Comparative Example 2

A substrate for mounting a semiconductor element thereon of Comparative Example 2 is an example of substrate for mounting a semiconductor element thereon in which a silver plating layer having a roughened surface with unevenness expressed by a surface area ratio (i.e. the ratio of the surface area of the roughened silver plating layer to the surface area of a corresponding smooth surface) of less than 1.30 is formed on top faces of columnar terminal portions.

In Comparative Example 2, up to formation of plating resist masks and pretreatment for electroplating at sites corresponding to columnar terminal portions on the upper surface side of a metal plate, steps were carried out substantially in the same manner as in Embodied Example 1. In the subsequent electroplating treatment, by use of a silver plating bath with a silver concentration of 65 g/L, which was composed of a cyan-based silver plating solution, plating was performed for 6 minutes at a current density of 3 A/dm$^2$, to form a silver plating layer with a thickness of 5.0 μm and having a smooth surface. Then, the surface of the silver plating layer was subjected to microetching treatment for 2 minutes by use of a stripping solution for silver plating, to form a roughened outer face with unevenness on the surface of the silver plating layer. The silver plating layer given the roughened outer face with unevenness had a thickness of 2.8 μm, which was about half the thickness of the silver plating layer having the smooth surface. After that, the columnar terminal portions and concavities were formed substantially in the same manner as in Embodied Example 1 and the etching resist masks were removed, thereby to obtain a substrate for mounting a semiconductor element thereon of Comparative Example 2.

Comparative Example 3

A substrate for mounting a semiconductor element thereon of Comparative Example 3 is an example of substrate for mounting a semiconductor element thereon in which an undercoat plating layer having a roughened outer surface is formed, upon use of columnar terminal portions formed on a base material of the substrate for mounting a semiconductor element thereon as a base, on top faces of the columnar terminal portions, and a silver plating layer is formed thereon.

In Comparative Example 3, up to formation of plating resist masks and pretreatment for electroplating at sites corresponding to columnar terminal portions formed on the upper surface side of a metal plate, steps were carried out substantially in the same manner as in Embodied Example 1. In the subsequent electroplating treatment, first, by use of a nickel plating bath composed of nickel sulfamate, nickel chloride and boric acid, plating was performed for 7 minutes and 30 seconds at a current density of 2 A/dm$^2$, to form a nickel plating layer with a thickness of about 5.0 μm and a smooth surface. Then, the outer surface of the nickel plating layer was subjected to microetching treatment for 2 minutes by use of a stripping solution for nickel plating, to form a roughened face with unevenness on the outer surface of the nickel plating layer. The nickel plating layer given the roughened face with unevenness had a thickness of 2.6 μm, which was about half the thickness of the nickel plating layer having the smooth surface. Then, by use of a silver plating bath with a silver concentration of 65 g/L, which was composed of a cyan-based silver plating solution, plating was performed for 1 minute and 30 seconds at a current density of 3 A/dm$^2$, to form, as following the shape of the roughened surface of the nickel plating layer, a silver plating layer with a thickness of 1.5 μm and a roughened surface with unevenness having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value). After that, the columnar terminal portions and concavities were formed substantially in the same manner as in Embodied Example 1 and the etching resist masks were removed, thereby to obtain a substrate for mounting a semiconductor element thereon of Comparative Example 3.

The plating composition requirements (type and thickness of plating layers, surface area ratio (i.e. ratio of surface area of (roughened or smooth) silver plating layer to surface area of corresponding smooth surface), proportions of crystal directions in the silver plating layer, and crystal grain diameter (average value)) for each of the substrates for mounting semiconductor elements thereon of Embodied Examples 1 to 5 and Comparative Examples 1 to 3 are shown in Table 1.

It is noted that the field of view observed at 10,000× through a scanning electron microscope (SEM: Scanning Electron Microscope) was analyzed by an electron backscatter diffraction analyzer (EBSD: Electron Backscatter Diffraction) so that the proportions of crystal directions were calculated upon allowable angles for the respective directions being set to 15°. Further, a diameter of a crystal grain was defined as a diameter of a circle with an area equivalent to that of the crystal grain, which was defined by a grain boundary where the direction difference was 15° or more.

The plating thickness of a silver plating layer was measured by an X-ray fluorescence analyzer (SFT3300 manufactured by SII), and the plating thickness of a plating layer using nickel/palladium/gold plating was measured by an X-ray fluorescence analyzer (SFT3300 manufactured by SII).

The surface area ratio was measured by use of a 3D laser microscope (OLS4100 manufactured by OLYMPUS).

The substrate for mounting a semiconductor element thereon of Comparative Example 1, with a shear strength of 10 MPa, was observed hardly to have a sufficient resin adhesiveness for practical use.

In contrast, as shown in Table 2, each of the substrates for mounting semiconductor elements thereon of Embodied Examples 1 to 5 had a shear strength 1.5 times the shear strength of the substrate for mounting a semiconductor element thereon of Comparative Example 1, and was observed to have a remarkably improved resin adhesiveness.

On the other hand, although each of the substrates for mounting semiconductor elements thereon of Comparative Examples 2 and 3 had an improved resin adhesiveness with a shear strength higher than the substrate for mounting a semiconductor element thereon of Comparative Example 1, it was only 1.1 times as high as the substrate for mounting a semiconductor element thereon of Comparative Example 1 and failed to achieve a remarkable effect of improved resin adhesiveness as in the substrates for mounting semiconductor elements thereon of Embodied Examples 1 to 5.

TABLE 1

| Example | Barrier Plating Layer | | | | | Outermost Ag Plating Layer | | | | | | |
| --- | --- | --- | --- | --- | --- | --- | --- | --- | --- | --- | --- | --- |
| | Surface Morphology | Thickness (μm) | | | | Surface Morphology | Thickness (μm) | Surface Area Ratio | Proportion of Crystal Direction (%) | | | Crystal Grain Diameter (μm) |
| | | Ag | Ni | Pd | Au | | | | <001> | <111> | <101> | |
| Embodied Example 1 | — | — | — | — | — | Acicular Projections | 1.5 | 3.1 | 8.7 | 16.3 | 23.6 | 0.1818 |
| Embodied Example 2 | Smooth | — | 1.0 | — | — | Acicular Projections | 0.5 | 3.0 | 9.2 | 16.1 | 22.7 | 0.1935 |
| Embodied Example 3 | Smooth | — | 1.0 | 0.01 | — | Acicular Projections | 0.6 | 3.1 | 8.8 | 15.9 | 23.2 | 0.2037 |
| Embodied Example 4 | Smooth | 1.1 | — | — | — | Acicular Projections | 0.6 | 2.9 | 9.0 | 15.8 | 22.8 | 0.1865 |
| Embodied Example 5 | Smooth | — | 1.0 | 0.01 | 0.001 | Acicular Projections | 0.5 | 3.1 | 8.6 | 16.3 | 23.0 | 0.1903 |
| Comparative Example 1 | — | — | — | — | — | Smooth | 2.5 | 1.1 | 23.4 | 12.3 | 6.3 | 0.3058 |
| Comparative Example 2 | — | — | — | — | — | Unevenness by Etching | 2.8 | 1.3 | 22.6 | 14.2 | 7.2 | 0.3268 |
| Comparative Example 3 | Unevenness by Etching | — | 2.6 | — | — | Unevenness following Ni Layer | 1.5 | 1.3 | 22.9 | 13.8 | 7.0 | 0.3120 |

Evaluation of Resin Adhesiveness

A cylindrical resin mold of Φ2 mm for evaluation purpose was formed on the roughened silver plating layer (the smooth silver plating layer in the case of Comparative Example 1) of each of the completed substrates for mounting semiconductor elements thereon of Embodied Examples 1 to 5 and Comparative Examples 1 to 3. The shear strength of this resin was measured with a bond tester Dage Series 4000 (manufactured by Dage Corporation), to evaluate resin adhesiveness.

The evaluation results of resin adhesiveness of Embodied Examples 1 to 5 and Comparative Examples 1 to 3 are shown in Table 2.

TABLE 2

| Examples | Adhesion Strength (MPa) | Process Time (Set to 100 for Comparative Example 1) | Amount of Ag Use (Set to 100 for Comparative Example 1) |
| --- | --- | --- | --- |
| Embodied Example 1 | 15 | 25 | 60 |
| Embodied Example 2 | 15 | 50 | 20 |
| Embodied Example 3 | 15 | 50 | 20 |
| Embodied Example 4 | 15 | 30 | 60 |
| Embodied Example 5 | 15 | 50 | 20 |
| Comparative Example 1 | 10 | 100 | 100 |
| Comparative Example 2 | 11 | 200 | 200 |
| Comparative Example 3 | 12 | 250 | 60 |

Evaluation of Productivity

Comparison was made regarding the processing time and the amount of silver plating required to form the surface morphology of the outermost plating layer in each of the substrates for mounting semiconductor elements thereon of Embodied Examples 1 to 5 and Comparative Examples 2 and 3 into the form having a roughened surface, to evaluate productivity. In evaluation of productivity, upon the processing time and the amount of use of silver plating for the substrate for mounting a semiconductor element thereon of Comparative Example 1, in which a smooth silver plating layer was formed as the outermost layer, being set to 100, respectively, relative numerical values were used as evaluation values. In addition, since a substrate for mounting a semiconductor element thereon should be subjected to plating process while being line-conveyed, the evaluation value of the processing time was calculated on the basis of the time required for forming a metal plating layer that required the longest plating time in the plating process for the substrate for mounting a semiconductor element thereon of each of Embodied Examples and Comparative Examples (Embodied Example 1: roughened silver plating, Embodied Examples 2, 3, and 5: smooth nickel plating, Embodied Example 4: smooth silver plating, Comparative Example 2: smooth silver plating, and Comparative Example 3: smooth nickel plating).

The evaluation results of productivity (the processing time and the amount of silver plating required to form the surface morphology of the outermost plating layer into the form having a roughened surface) of Embodied Examples 1 to 5 and Comparative Examples 2 and 3 are shown in Table 2.

The substrate for mounting a semiconductor element thereon of Comparative Example 2 is an example in which, after formation of a silver plating layer with a smooth surface and a thickness of about 5.0 µm, a roughened, uneven surface was formed at the outer surface of the silver plating layer by microetching treatment with use of a silver plating stripping solution. The thickness of the silver plating layer with a roughened, uneven surface was 2.8 µm, which is about half the thickness of the silver plating layer with a smooth surface. As shown in Table 2, with the processing time being 200 and the amount of silver use being 200, the productivity was observed to be poor because of, in addition to the long processing time, a very high cost of silver, the prime cost of which is expensive.

The substrate for mounting a semiconductor element thereon of Comparative Example 3 is an example in which, after formation of a nickel plating layer with a smooth surface and a thickness of about 5.0 µm, a roughened, uneven surface was formed at the outer surface of the silver plating layer by microetching treatment with use of a nickel plating stripping solution. The thickness of the nickel plating layer with a roughened, uneven surface was 2.6 µm, which is about half the thickness of the nickel plating layer with a smooth surface. As shown in Table 2, with the processing time being 250 and the amount of silver use being 60, it was observed that, although the cost of silver could be saved to some extent, the productivity was very poor because of the very long processing time.

On the other hand, as shown in Table 2, for every one of the substrates for mounting semiconductor elements thereon of Embodied Examples 1 to 5, the processing time was 25 to 50 and the amount of silver use was 20 to 60. The productivity was observed to be remarkably improved with the processing time being reduced by 75 to 87.5% and the amount of silver use being reduced by 70 to 90% as compared with the substrate for mounting a semiconductor element thereon of Comparative Example 2.

In addition, the substrates for mounting semiconductor elements thereon of Embodied Examples 2, 3, and 5 were observed to achieve remarkably improved productivity with the processing time being reduced by 80% and the amount of silver use being reduced by 67% as compared with the substrate for mounting a semiconductor element thereon of Comparative Example 3. Regarding the substrates for mounting semiconductor elements thereon of Embodied Examples 1 and 4, although the amount of silver use was about the same as the substrate for mounting a semiconductor element thereon of Comparative Example 3, it was significantly reduced as compared with the substrate for mounting a semiconductor element thereon of Comparative Example 2. In addition, the processing time was reduced by 88 to 90% as compared with the substrate for mounting a semiconductor element thereon of Comparative Example 3. In this way, the substrate for mounting a semiconductor element thereon of Embodied Examples 1 and 4 were observed to achieve remarkably improved productivity.

While the preferred embodiment modes and the embodied examples of the present invention have been described in detail above, the present invention is not limited to the embodiment modes and the embodied examples described above. Various modifications and substitutions may be made to the embodiment modes and the embodied examples described above without deviating from the scope of the present invention.

The description has been made that, regarding the substrate for mounting a semiconductor element thereon of the present invention, the base material of the substrate for mounting a semiconductor element thereon is a copper-based material such as a copper alloy. However, a nickel-based alloy also may be employed as the base material of the substrate for mounting a semiconductor element thereon.

Further, in the substrate for mounting a semiconductor element thereon of the present invention, as long as its thickness does not impair the surface area ratio and the crystal structure of the roughened surface having acicular projections, a silver plating layer or plating layers combining nickel, palladium, and gold may be laminated, as a plating layer for cover, on the roughened silver plating layer having acicular projections provided as the outermost layer.

What is claimed is:

1. A substrate for mounting a semiconductor element thereon, comprising:
    a metal plate made of a copper-based material, having columnar terminal portions formed by concavities formed on an upper surface thereof; and
    a roughened silver plating layer having acicular projections, covering top faces of the columnar terminal portions, wherein the roughened silver plating layer has a crystal structure in which the crystal direction <101> occupies a largest proportion among the crystal directions <001>, <111> and <101>.

2. The substrate for mounting a semiconductor element thereon according to claim 1,
    wherein an average diameter of crystal grains in the roughened silver plating layer is smaller than 0.28 µm.

3. The substrate for mounting a semiconductor element thereon according to claim 1,
    wherein an undercoat plating layer is provided between the top faces of the columnar terminal portions and the roughened silver plating layer.

4. The substrate for mounting a semiconductor element thereon according to claim 2,
    wherein an undercoat plating layer is provided between the top faces of the columnar terminal portions and the roughened silver plating layer.

* * * * *